United States Patent
Chen et al.

(10) Patent No.: US 9,423,560 B2
(45) Date of Patent: Aug. 23, 2016

(54) ELECTRONIC/PHOTONIC INTEGRATED CIRCUIT ARCHITECTURE AND METHOD OF MANUFACTURE THEREOF

(75) Inventors: Long Chen, North Brunswick, NJ (US); Pietro Bernasconi, Aberdeen, NJ (US); Po Dong, Morganville, NJ (US); Liming Zhang, Marlboro, NJ (US); Young-Kai Chen, Berkeley Heights, NJ (US)

(73) Assignee: Alcatel Lucent, Boulogne-Billancourt (FR)

( * ) Notice: Subject to any disclaimer, the term of this patent is extended or adjusted under 35 U.S.C. 154(b) by 682 days.

(21) Appl. No.: 13/326,583

(22) Filed: Dec. 15, 2011

(65) Prior Publication Data

US 2013/0156364 A1     Jun. 20, 2013

(51) Int. Cl.
| | |
|---|---|
| G02B 6/12 | (2006.01) |
| H01L 27/15 | (2006.01) |
| H01S 5/026 | (2006.01) |
| G02B 6/122 | (2006.01) |
| G02F 1/015 | (2006.01) |

(52) U.S. Cl.
CPC ........ *G02B 6/12004* (2013.01); *G02B 6/12002* (2013.01); *G02B 6/1228* (2013.01); *G02F 1/015* (2013.01); *H01L 27/15* (2013.01); *H01S 5/026* (2013.01); *H01S 5/0261* (2013.01)

(58) Field of Classification Search
None
See application file for complete search history.

(56) References Cited

U.S. PATENT DOCUMENTS

| | | | |
|---|---|---|---|
| 6,579,398 B1 | 6/2003 | Ogawa | |
| 6,895,134 B2 * | 5/2005 | Glogovsky | G02B 6/132 257/14 |
| 7,070,207 B2 * | 7/2006 | Asai | G02B 6/12002 257/113 |
| 7,167,608 B2 * | 1/2007 | Ogawa | G02B 6/42 385/14 |
| 7,203,387 B2 * | 4/2007 | Doan | 385/14 |

(Continued)

FOREIGN PATENT DOCUMENTS

| | | |
|---|---|---|
| JP | H03168705 A | 7/1991 |
| JP | H0682642 A | 3/1994 |

(Continued)

OTHER PUBLICATIONS

Foreign Communication From a Related Counterpart Application, PCT Application PCT/US2012/068437, International Search Report and Written Opinion dated Mar. 11, 2013, 11 pages.

(Continued)

*Primary Examiner* — Tina Wong
(74) *Attorney, Agent, or Firm* — Parker Justiss, PC

(57) ABSTRACT

A device includes a passive photonic layer located over a substrate and including at least one passive photonic element configured to propagate an optical signal therein. An electronic layer located between said substrate and said passive photonic layer includes at least one electronic device configured to propagate an electrical signal therein. An active photonic layer located over said passive photonic layer includes an active photonic device optically coupled to said passive photonic element and configured to convert between said electrical signal and said optical signal.

23 Claims, 21 Drawing Sheets

(56) References Cited

U.S. PATENT DOCUMENTS

| | | | |
|---|---|---|---|
| 7,324,720 B2 * | 1/2008 | Pistemaa | G02B 6/4204 385/14 |
| 7,778,501 B2 * | 8/2010 | Beausoleil | B82Y 20/00 385/14 |
| 8,260,151 B2 | 9/2012 | Pelley et al. | |
| 8,428,401 B2 * | 4/2013 | Tilly | 385/14 |
| 8,437,584 B2 * | 5/2013 | Matsuoka | G02B 6/43 385/14 |
| 2003/0026575 A1 | 2/2003 | Lempkowski | |
| 2003/0091264 A1 * | 5/2003 | Kimerling | 385/14 |
| 2003/0140317 A1 * | 7/2003 | Brewer et al. | 716/1 |
| 2004/0105609 A1 | 6/2004 | Stegmuller | |
| 2005/0053319 A1 | 3/2005 | Doan | |
| 2005/0179986 A1 * | 8/2005 | Gothoskar | G02F 1/025 359/321 |
| 2008/0308311 A1 * | 12/2008 | Kodama | G02B 6/42 174/260 |
| 2009/0078963 A1 | 3/2009 | Khodja | |

FOREIGN PATENT DOCUMENTS

| | | |
|---|---|---|
| JP | 2009176875 A | 8/2009 |
| TW | 200614501 A | 5/2006 |
| TW | 200950077 A | 12/2009 |
| WO | 02061473 A2 | 8/2002 |
| WO | 2006031601 A1 | 3/2006 |

OTHER PUBLICATIONS

Search Report, Taiwan Patent Application No. 101146442, dated Jul. 17, 2014, 1 page.

Notice of Reason for Refusal, Japan Patent Application No. 2014-547314, dated Jun. 18, 2015, 4 pages.

* cited by examiner

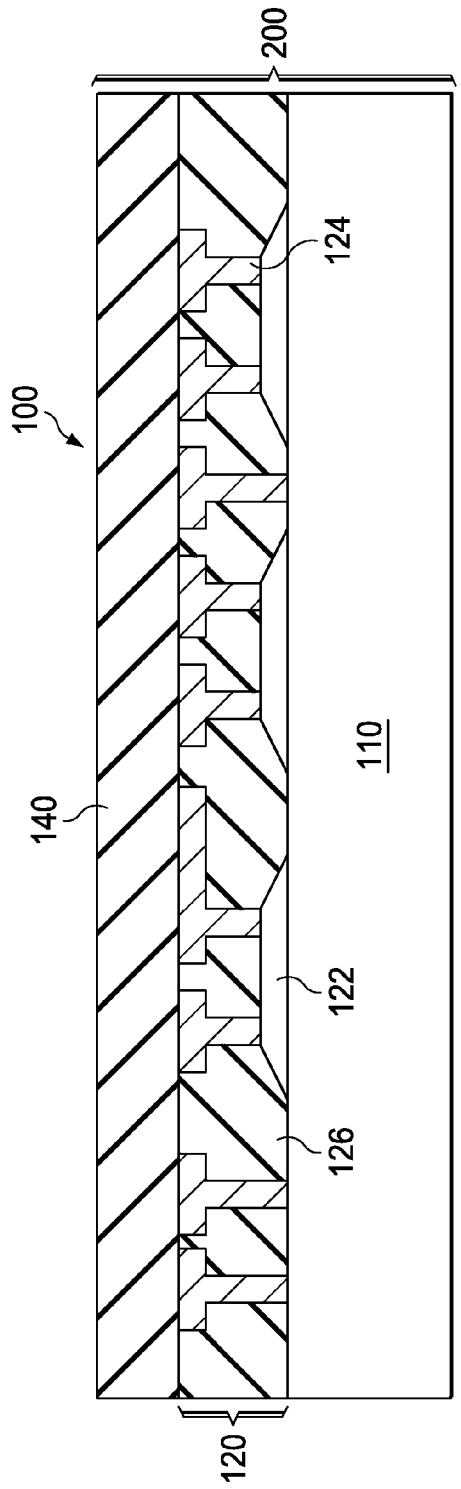
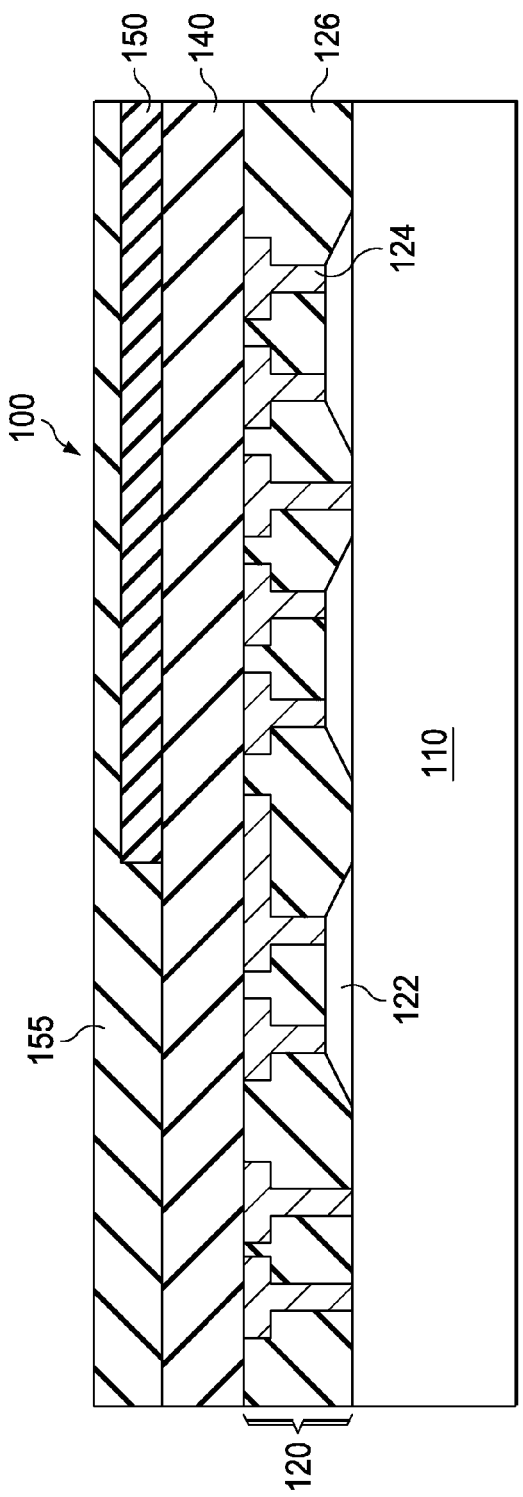

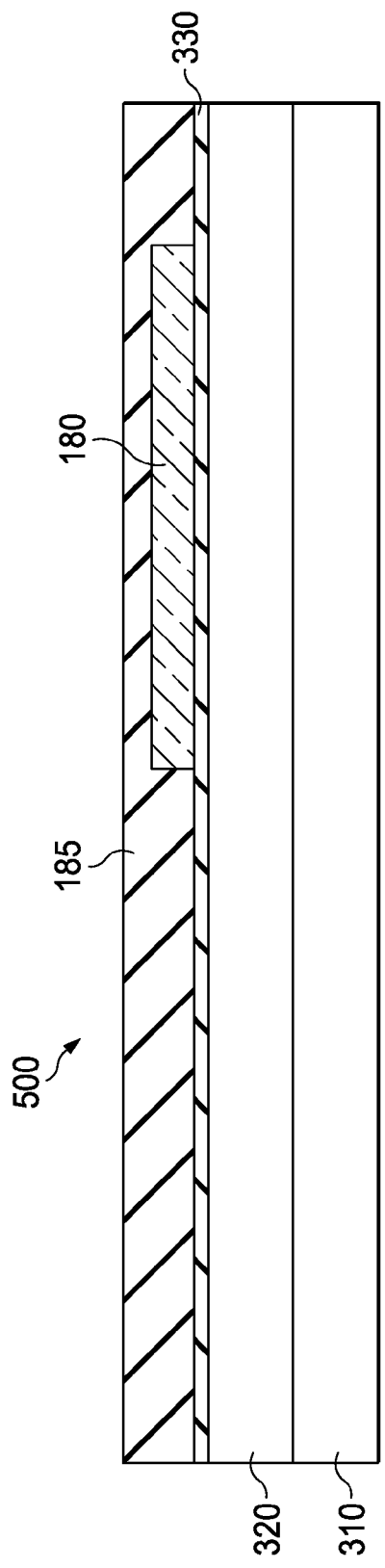
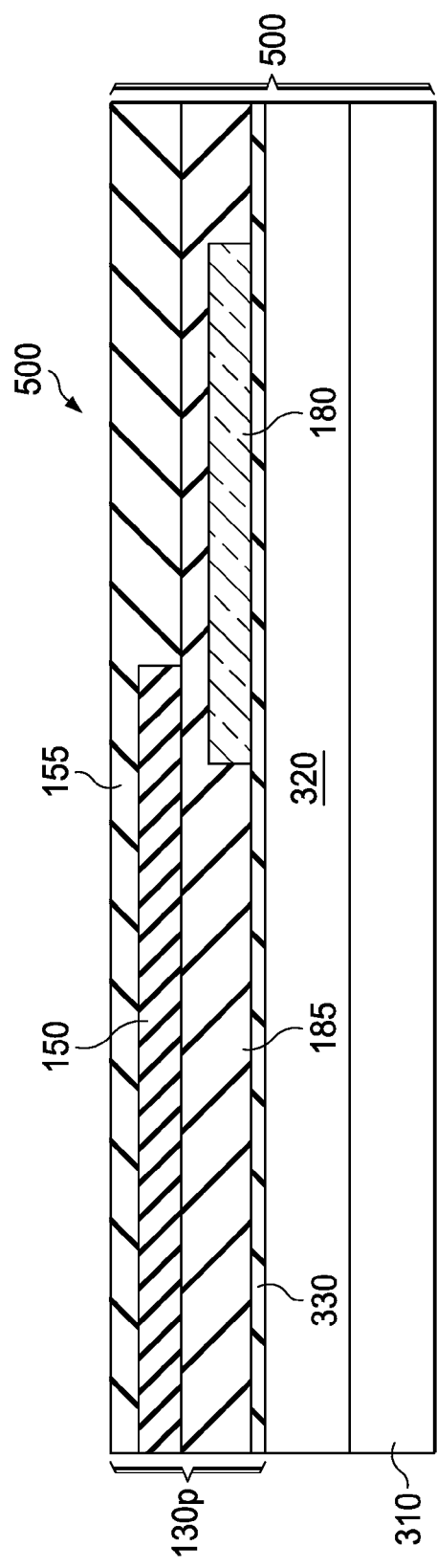
FIG. 5B
FIG. 5C

US 9,423,560 B2

ELECTRONIC/PHOTONIC INTEGRATED CIRCUIT ARCHITECTURE AND METHOD OF MANUFACTURE THEREOF

TECHNICAL FIELD

This application is directed, in general, to an integrated circuit (IC) and, more specifically, to electronic/photonic IC architectures and method of manufacture thereof.

BACKGROUND

This section introduces aspects that may be helpful to facilitating a better understanding of the inventions. Accordingly, the statements of this section are to be read in this light and are not to be understood as admissions about what is in the prior art or what is not in the prior art.

Optical components and electronics are sometimes integrated in a single device. Such integrated devices are typically limited to optical components such as waveguides and electro-optic modulators, and are configured to optically couple to a laser located separately from the device.

SUMMARY

One aspect provides a device including a passive photonic layer located over a substrate and including at least one passive photonic element configured to propagate an optical signal therein. An electronic layer located between said substrate and said passive photonic layer includes at least one electronic device configured to propagate an electrical signal therein. An active photonic layer located over said passive photonic layer includes an active photonic device optically coupled to said passive photonic element and configured to convert between said electrical signal and said optical signal.

Another aspect provides a method that includes forming a passive photonic layer over a device substrate. The passive photonic layer includes at least one passive photonic element configured to propagate an optical signal therein. An electronic layer that is located between said device substrate and said passive photonic layer is formed, wherein the electronic layer includes at least one electronic device configured to propagate an electrical signal therein. An active photonic layer located over said passive photonic layer is formed. The active photonic layer includes an active photonic device optically coupled to said passive photonic element and configured to convert between said electrical signal and said optical signal.

BRIEF DESCRIPTION

Reference is now made to the following descriptions taken in conjunction with the accompanying drawings, in which:

FIG. 1 schematically illustrates a sectional view of an integrated photonic-electronic device 100 according to one embodiment, including an active photonic device 160, a passive optical element 150, an optical transition element 180, an electronic device layer 120 and a photonic device layer 130;

FIGS. 2A-2I illustrate steps in the formation of the device 100 according to one embodiment;

Figure 1:
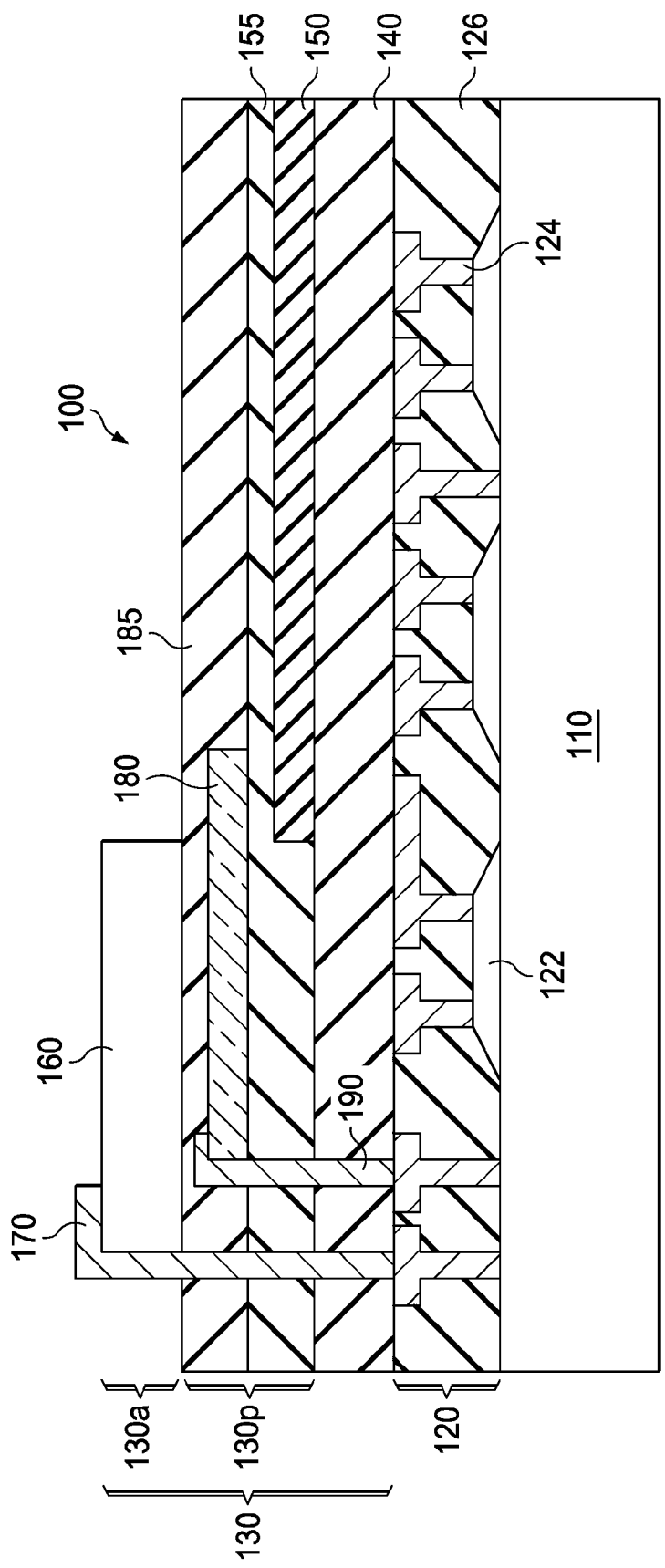
Figure 4A:
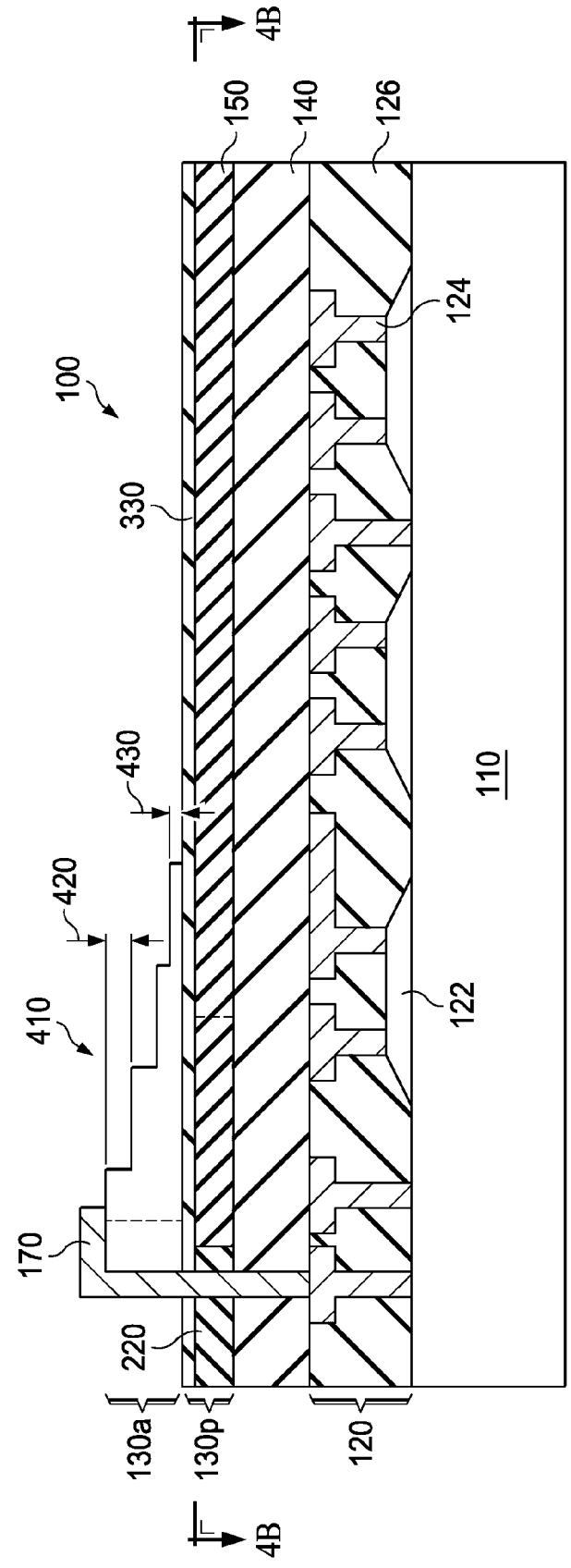
Figure 4B:
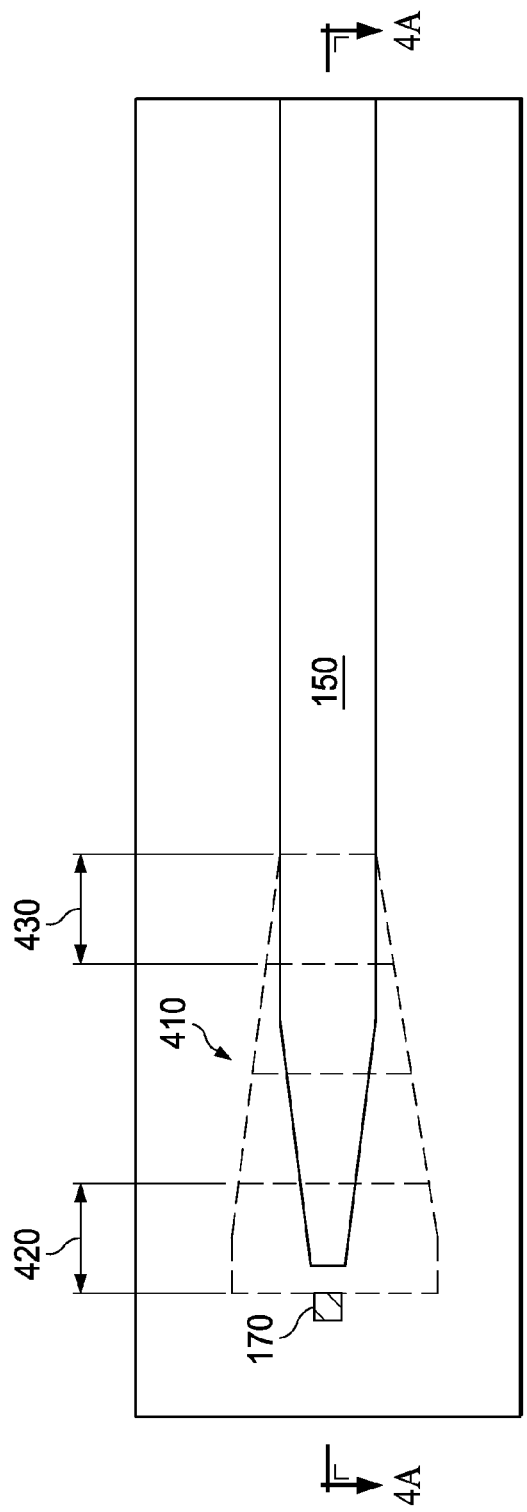

FIGS. 4A and 4B illustrate an embodiment in which the transition element 180 in the photonic device of FIG. 1 is omitted, and the active photonic device 160 is configured to increase direct optical coupling to the passive optical element 150;

FIGS. 5A-5G schematically illustrate formation of the photonic-electronic device 100 by forming a subassembly 500 that includes the transition element 180 and the passive optical element 150, and joining the subassembly 500 to the partially formed device 100; and FIGS. 6A-6F schematically illustrate formation of the photonic-electronic device 100 by forming a subassembly 600 that includes an SOI substrate having a crystalline semiconductor layer located over a dielectric layer.

DETAILED DESCRIPTION

There is a growing need for integration of electronic (e.g. CMOS) and active, e.g. powered, photonic circuits on a single integrated photonic-electronic circuit. Such integration may make possible significant performance improvement of photonic-electronic systems by, e.g. reducing many parasitic effects associated with packaging of conventional system solutions, and could also reduce the device foot-print, power consumption, and manufacturing cost.

The present disclosure provides and describes an integration scheme to bring semiconductor (e.g. silicon) based electronics, passive photonics and III-V based active photonic elements together over a single substrate, allowing monolithic integration of these components on a wafer scale. Such integration allows the manufacturing of integrated photonic-electronic devices on semiconductor fabrication tool sets, providing for economy of scale and high throughput to significantly reduce costs and increase market penetration of such devices.

While some aspects of photonic-electronic integration have been explored in the past, each approach has suffered from deficiencies that render that approach unsuitable for large-scale integration and/or practical devices. For instance, attempts to integrate amorphous silicon waveguides with integrated electronics have suffered from excessive losses in the optical waveguides limiting the size of the device and/or requiring optical repeaters to amplify the attenuated optical signals. Moreover, limitations on thermal budget after formation of the integrated electronics constrain the formation of optical waveguide materials that may require high processing temperatures to achieve better optical properties, e.g. lower loss.

Embodiments of the invention enable the integration of photonic and electronic circuits by decoupling the processing of the electronic and photonic device, employing structural features to improve coupling between optical features, or both. In some embodiments novel arrangements of features provides sufficient optical coupling and low loss to enable practical photonic-electronic circuits.

Embodiments herein described may include silicon-based CMOS electronics, passive photonic circuits (e.g. interconnecting optical waveguides, splitters, filters and multiplexers/demultiplexers, and active photonic elements (e.g. lasers, optical amplifiers, modulators and detectors). The active optical elements may comprise a III-V compound semiconductor-based material. These devices may include lasers, amplifiers, modulators, etc., integrated with silicon-based electronics over a common semiconductor substrate.

Turning to FIG. 1, a device 100, e.g. an integrated photonic-electronic device, is illustrated schematically in sectional view. The device 100 includes a substrate 110 upon which various structures described below are located. The substrate 110 in some embodiments is a semiconductor substrate such as silicon, germanium or GaAs. Unless otherwise stated herein, when a semiconductor material is described the material may include a doped or an intrinsic form of the semiconductor. In some other embodiments the substrate 110 is a dielectric material such as quartz or sapphire. In some embodiments the substrate is a semiconductor-over-insulator substrate, e.g. silicon-over-insulator (SOI). Regardless of the material type, in various embodiments it is preferred that the substrate 110 be a portion of a larger substrate suitable for mass production in semiconductor fabrication tools. Such a form may be, e.g. a 150 mm, 200 mm or 300 mm diameter wafer.

Over the substrate 110 is located an electronic device layer 120. The electronic device layer 120 includes various elements that may be used in conventional integrated electronic circuits, e.g. active electronic devices such as transistors 122; passive electronic elements such as contacts, vias, and interconnects 124; and various diffusion barriers and dielectric layers 126. Various electrical functions may be provided by the electronic device layer 120, e.g. drivers, electrical amplifiers and digital signal processing. Those skilled in the pertinent art are familiar with methods of fabricating such devices.

Over the electronic device layer 120 is an integrated photonic device layer 130. The photonic device layer 130 includes a cladding layer 140, a passive photonic layer 130*p* and an active photonic layer 130*a*. The cladding layer 140 comprises a dielectric medium, e.g. silicon oxide (silica), having a refractive index suitable to support optical signal propagating modes in waveguides and other photonic elements in contact with the cladding layer 140. The passive photonic layer 130*p* and the active photonic layer 130*a* each include a cladding medium and an optical guiding medium as described below. The cladding layer 140 and photonic layers 130*a* and 130*p* may also include layers unrelated to their optical roles, e.g. barrier layers, stop etch layers and the like.

The passive photonic layer 130*p* includes a passive optical element 150. The element 150 is referred to herein as passive because it does not convert between the electrical domain and the optical domain. The element 150 may include various features such as electrodes, e.g. to control an optical path length such as in a thermo-optical phase shifter or a thermo-optical switch, and still be considered passive. The passive optical element 150 is representative of any number of waveguide structures or other passive photonic elements formed at the same stratum of the photonic device layer 130. For example, the photonic device layer 130 may include, without limitation, multiple instances of the waveguide 150, splitters, filters, and multiplexers/demultiplexers. For simplicity of this description the passive optical element may be referred to herein without limitation as a dielectric waveguide 150. The dielectric waveguide 150 and any such other passive photonic elements have a refractive index greater than that of the cladding layer 140 so that optical signals are confined around the dielectric waveguide 150 and propagate therein. For example, the dielectric waveguide 150 may be formed from silicon nitride, silicon oxynitride, or silica doped to have a refractive index greater than that of undoped silica.

A cladding layer 155 is located adjacent to the dielectric waveguide 150. The cladding layer 155 may be a dielectric material that has a refractive index less than the refractive index of the dielectric waveguide 150. This aspect is discussed in greater detail below.

The active photonic layer 130*a* is located over the passive photonic layer 130*p*. The layer 130*a* includes an active photonic device 160. The active photonic device 160 may, e.g. generate, amplify, modulate, or detect an optical signal. A via structure 170 conductively couples the active photonic device 160 to an unreferenced electrical device within the electronic device layer 120. The active photonic device 160 may be viewed as an electro-optic transducer configured to convert an electrical signal received from the electrical device to an optical signal, or to convert an optical signal received from the dielectric waveguide 150 to an electrical signal. In a nonlimiting example, in some embodiments the active photonic device 160 may be a laser configured to produce a narrow-spectrum optical signal in response to an electrical signal received by way of the via structure 170, and to couple the signal to the dielectric waveguide 150. Herein, the term "electrical signal" includes an unmodulated current that may cause the active photonic device 160 to emit a continuous wave (CW) light signal, or a modulated current that may cause the active photonic device 160 to emit a modulated light signal. In other nonlimiting embodiments, the active photonic device 160 may be a diode, e.g. a photodiode, configured to convert a modulated or CW optical signal received from the dielectric waveguide 150 to a respective modulated or unmodulated electrical signal.

In various embodiments the active photonic device 160 comprises a semiconductor based on a III-V compound, such as GaAs, InP, $GaAs_xP_{1-x}$, $In_xGa_{1-x}As_yP_{1-y}$ and the like. In various embodiments the active photonic device 160 includes doped regions that have an associated depletion region therebetween.

In some cases the active photonic device 160 may also include one or more intrinsic semiconductor regions. In some embodiments the active photonic device 160 includes a sandwich structure including layers of $In_xGa_{1-x}As_yP_{1-y}$ having an alternating stoichiometry.

In the illustrated embodiment the passive photonic layer 130*p* also includes an optical transition element 180. The transition element 180 is configured to facilitate coupling between the dielectric waveguide 150 and the active photonic device 160. The dielectric waveguide 150 may include an optical mode coupler or other structural features that have the effect of more effectively coupling light between the dielectric waveguide 150 and the active photonic device 160 than would be the case in the absence of the transition element 180. In some embodiments the transition element 180 comprises a semiconductor. In some embodiments the semiconductor is doped or undoped silicon, which may further be monocrystalline or polycrystalline. "Monocrystalline" means the atoms of the semiconductor layer from which the transition element 180 is formed are substantially located at lattice locations of a single crystalline lattice. A via structure 190 may conductively couple the transition element 180 to a bias voltage source within the electronic device layer 120. The bias voltage may, e.g. modify the optical characteristics of the transition element 180 such as by depleting the transition element 180 of majority charge carriers, e.g. electrons.

The embodiment of FIG. 1 illustrates the active photonic device 160 being located over the transition element 180, and the transition element 180 overlapping the dielectric waveguide 150. In embodiments for which the transition element 180 is not present, the active photonic device 160 may be located at least partially over the dielectric waveguide 150.

Turning now to FIGS. 2A-2I, a method of forming the device 100 is described without limitation to a particular method. Additional aspects of the device 100 are described in the context of the following description. Like reference numbers in FIGS. 2A-2I refer to like features of FIG. 1.

In FIG. 2A the method begins with providing the substrate 110. Herein and in the claims, "providing" and similar terms mean that a device, substrate, structural element, etc., may be manufactured by the individual or business entity performing the disclosed methods, or obtained thereby from a source other than the individual or entity, including another individual or business entity. The substrate 110 may be one of any of the materials previously described, and may preferably be a wafer.

FIG. 2A shows the device 100 after formation of the electronic device layer 120 over the substrate 110. Those skilled in the pertinent art will appreciate that the formation of the dielectric layers 126 and interconnects 124 may include numerous process steps typically conducted in a clean room environment. Formation of the electronic device layer 120 may include any conventional or novel processes and/or sequence of processes. When the electronic device layer 120 is complete, the electronic device layer 120 typically includes a functional electronic device as determined in part by the configuration of the transistors 122 and the interconnects 124. The interconnects 124 may include, e.g. tungsten plugs, copper or aluminum vias, and copper or aluminum traces, as well as barrier layers and stop layers. The electronic device layer 120 may be planarized by, e.g. chemical mechanical polishing (CMP).

The cladding layer 140 is formed over the electronic device layer 120. The cladding medium operates in part to provide a base on which to form the overlying active photonic layer 130a and passive photonic layer 130p. The cladding layer 140 may be formed by any conventional or novel process, e.g. a plasma deposition process such as plasma-enhanced chemical vapor deposition (PE-CVD). In a non-limiting example, the cladding layer 140 comprises silicon oxide, silicon nitride or silicon oxynitride. In some embodiments the cladding layer 140 is doped during deposition, e.g. to lower the refractive index $n_{cladding}$. For example, the cladding layer 140 may be doped with, e.g. carbon or fluorine. In a non-limiting example, the cladding medium is a carbon doped or fluorine doped silicon-oxide type material. In some cases the cladding medium is a low-k dielectric material, such as fluorinated silicon oxide or Black Diamond™. In some cases the cladding medium is an organic material, such as BCB.

FIG. 2B shows the device 100 after the dielectric waveguide 150 is formed over the cladding layer 140. The device 100 at this stage of formation is designated as subassembly 200 for later reference. The dielectric waveguide 150 is formed by any conventional or novel process in which a blanket dielectric layer is first formed over the cladding layer 140 and then patterned to define the lateral extents of the dielectric waveguide 150. The blanket layer may have a thickness, e.g. in a range within about 200 to about 2000 nm when the photonic device layer 130 is configured to operate with light in the near infrared (for example, within a range from about 1200 nm to about 2000 nm in wavelength). The dielectric waveguide 150 is formed from a material having a refractive index $n_{core} > n_{cladding}$. The dielectric waveguide 150 layer may be formed, e.g. from undoped silicon oxide when the cladding layer 140 is doped to have a refractive index less than that of silicon oxide. In some embodiments the dielectric waveguide 150 layer is formed from silicon oxynitride. In some embodiments both the cladding layer 140 and the dielectric waveguide 150 layer are both silicon oxynitride, wherein the cladding layer 140 has a lower concentration of nitrogen than does the dielectric waveguide 150. In some embodiments the dielectric waveguide 150 is formed from silicon nitride.

The cladding layer 155 is formed over and around the dielectric waveguide 150. The cladding layer 155 may be any of the materials described with respect to the cladding layer 140. In some embodiments the cladding layers 140 and 155 are formed from a same material type, e.g. both comprising silicon oxide and have having a same refractive index. However, the device 100 is not limited to such embodiments. The cladding layer 155 may be planarized, e.g. by CMP, before forming additional material layers thereover.

Figure 2C:
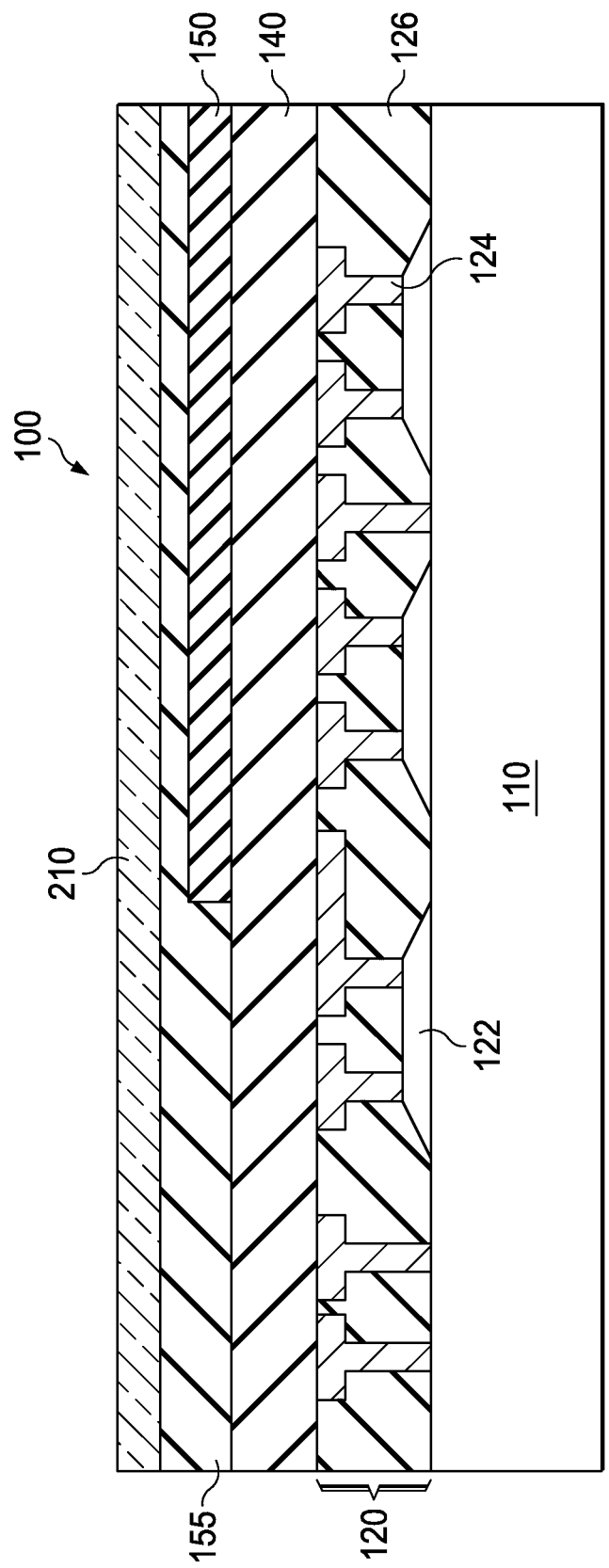

In FIG. 2C an optional semiconductor layer 210 has been formed over the cladding layer 155. The semiconductor layer 210 may be, e.g. an amorphous or polycrystalline silicon layer. The semiconductor layer 210 may have a thickness, e.g. with a range from about 200 nm to about 500 nm when the photonic device layer 130 is configured to operate with near infrared light. The semiconductor layer 210 is preferably formed by a process that does not exceed a thermal budget of the electronic device layer 120. As appreciated by those skilled in the electronic arts, the electronic device layer 120 typically includes dopant profiles carefully tailored to produce desired electronic performance of the electronic device located therein, as well as metallizations with various vias and traces. If the electronic device layer 120 were exposed to too high a temperature, or en elevated temperature for too long, then the dopant profiles and metallizations within the electronic device layer 120 may change, thereby altering the performance of the electronic device.

Accordingly the semiconductor layer 210 may be formed using a relatively low temperature process, e.g. not exceeding 450° C. In a nonlimiting embodiment, the semiconductor layer 210 is formed at or below about 400° C. using a PECVD process. Those skilled in the pertinent art are familiar with such processes.

Figure 2D:
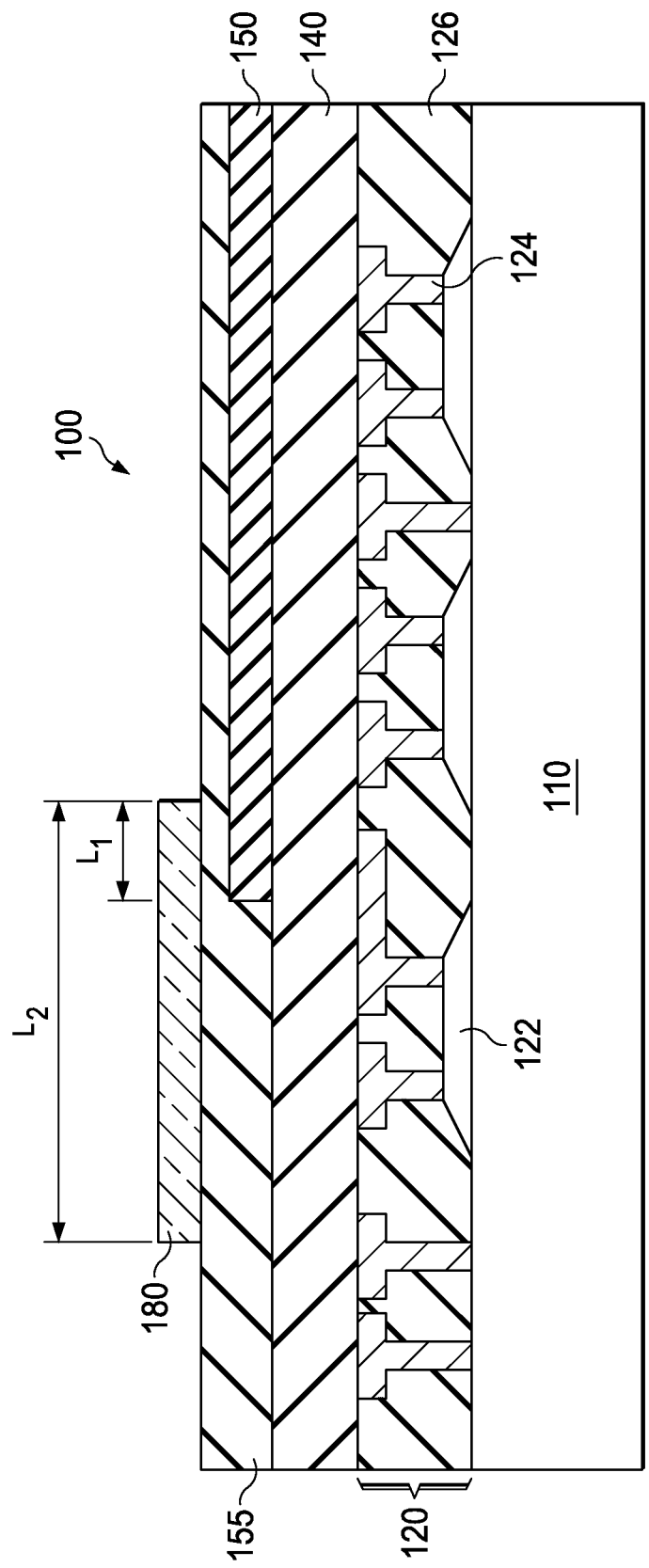

In FIG. 2D the semiconductor layer 210 has been patterned using, e.g. a conventional process, to form the transition element 180. The transition element 180 is located to optically couple to the dielectric waveguide 150, and thus overlaps the dielectric waveguide 150 by a length $L_1$. The overlap length $L_1$ may be, e.g. about 50 µm when the transition element 180 comprises amorphous silicon ($n_r \approx 3.5$) and the dielectric waveguide 150 comprises silicon nitride with $n_r \approx 2.0$. Moreover, the transition element 180 may be limited to a length $L_2$ that limits optical losses within the transition element 180 to a maximum value. For example, in some cases amorphous silicon may impose a loss of 10-20 dB/cm on an optical signal propagating therein. In some embodiments the length $L_2$ is limited to limit the optical loss to about 0.5 dB or less. Thus the length $L_2$ may preferably be less than about 250 µm, and more preferably less than about 200 µm.

Figure 2E:
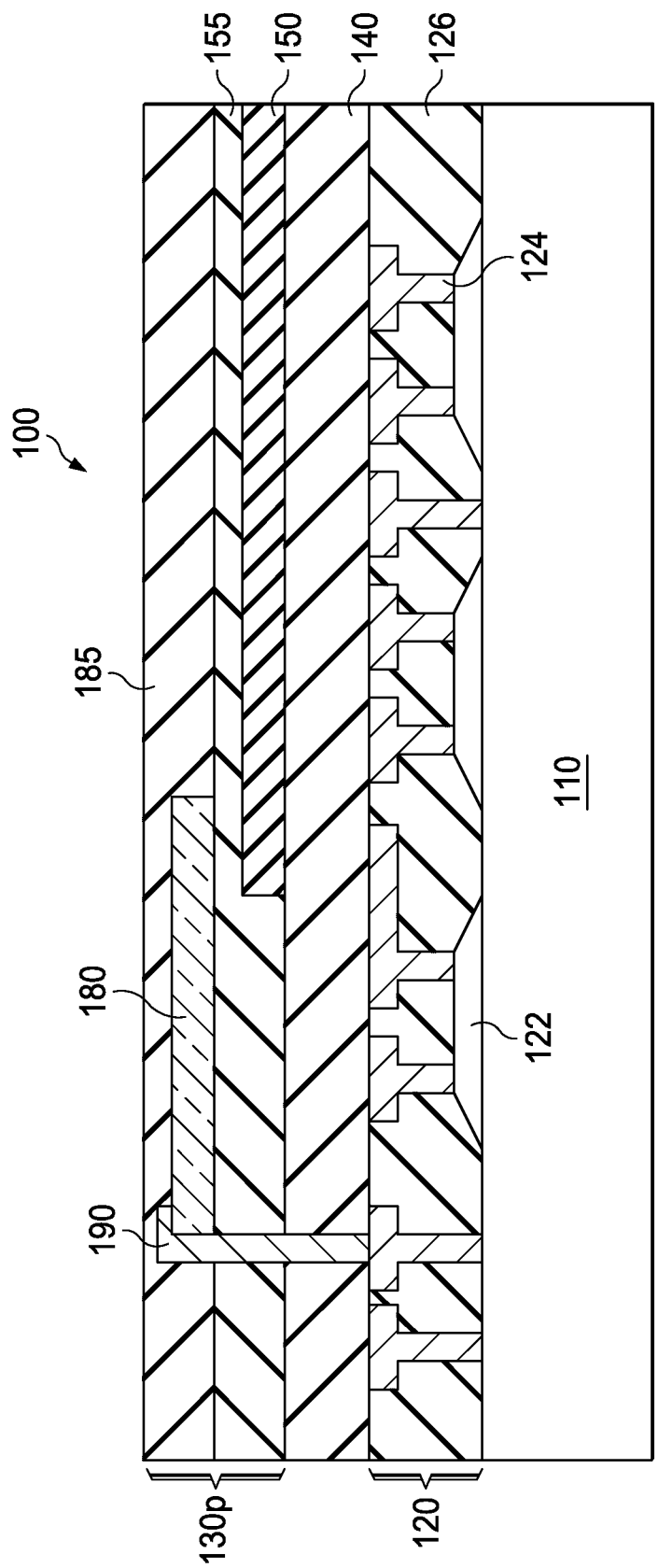

FIG. 2E illustrates the device after forming a cladding layer 185 over the transition element 180. The cladding layer 185 may comprise a material having a refractive index less than that of the transition element 180 and that of the dielectric waveguide 150. The cladding layer 185 may be selected from materials including silicon dioxide, silicon oxynitride or another dielectric material with an appropriate refractive index. The cladding layer 185 may also be planarized as illustrated.

Also shown in FIG. 2E is a via structure 190 that connects the transition element 180 to the electronic device layer 120. The via structure 190 provides a conductive path to apply a bias to the transition element 180 if desired. A bias may be used, e.g. to modify the optical transmission characteristics of the transition element 180. Such modification may be static, e.g. a DC bias, or may be dynamic, e.g. switched. In some embodiments, a heater element (not shown) may be formed from the semiconductor layer 210. The heater element may be located to heat a portion of the passive photonic element thereby modifying the optical transmission characteristics of the element, such as when the element is a thermo-optical phase shifter. The heater element may be powered by an electronic device within the electronic device layer 120 via two or more via structures analogous to the via structure 190.

Figure 2F:
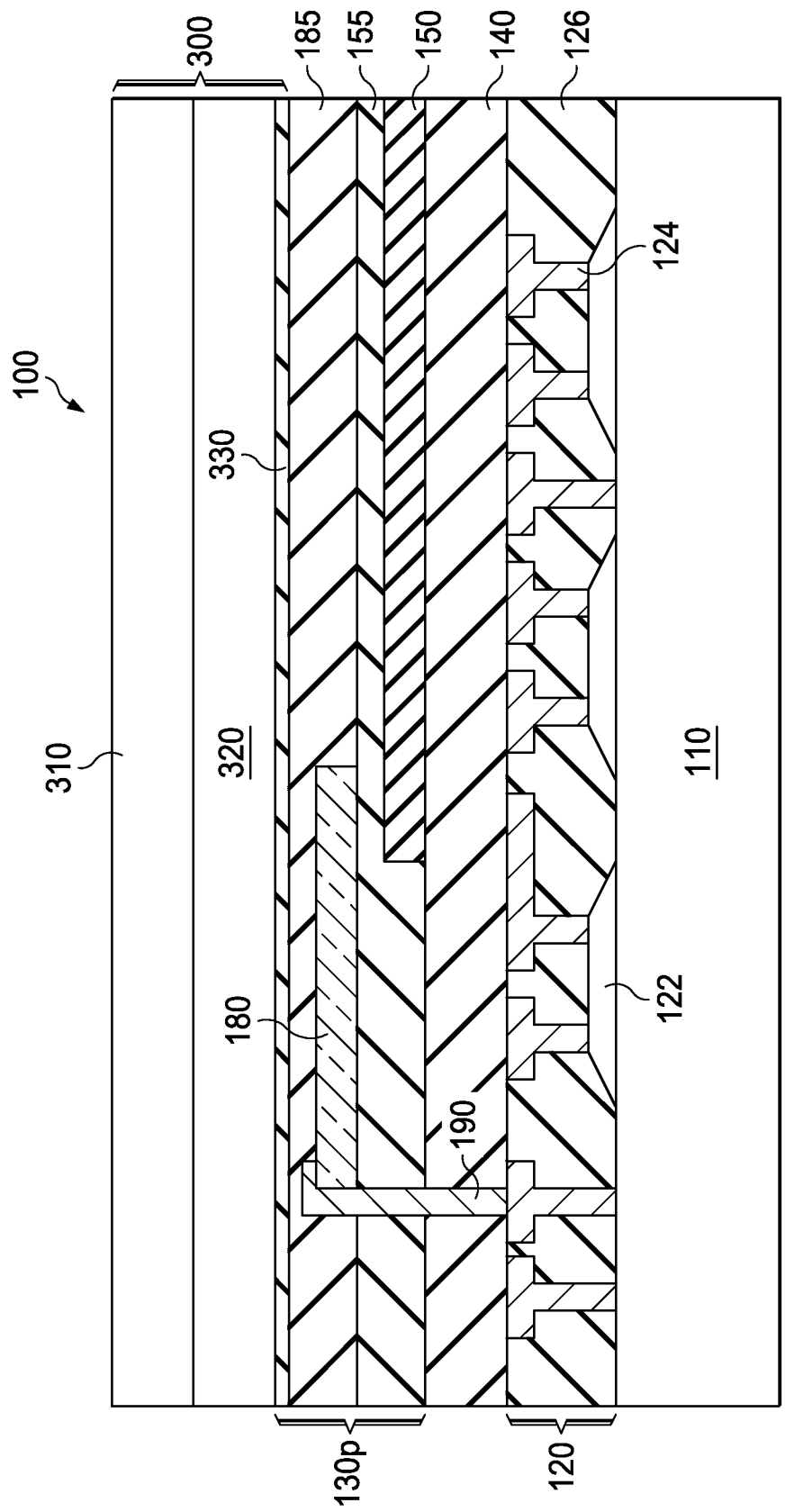
Figure 3:
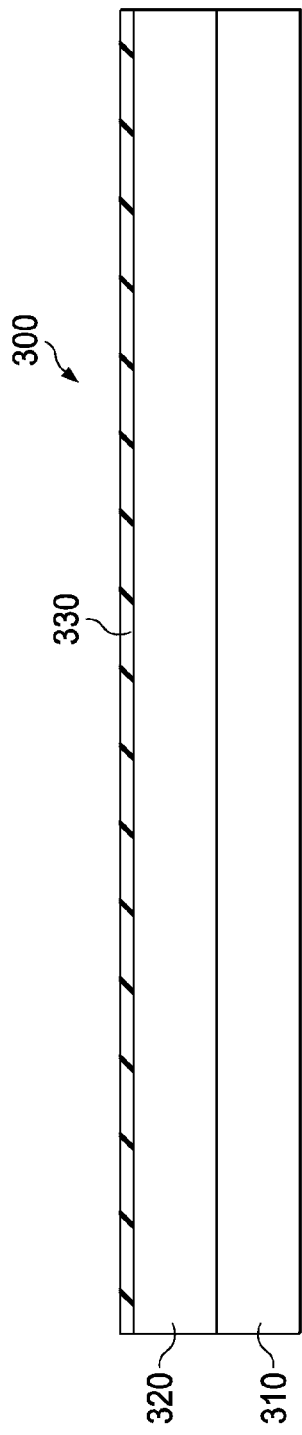
FIG. 3 illustrates formation of a subassembly including an active photonic device layer on a handle wafer according to one embodiment, the active photonic device layer being later joined to the partially formed photonic-electronic device 100.

FIG. 2F illustrates the device 100 after a subassembly 300 is joined to the cladding layer 185. The subassembly 300 includes a handle wafer 310 and an active photonic layer 320 attached thereto. FIG. 3 illustrates the subassembly 300 in isolation for clarity. The handle wafer 310 may be any substrate on which the active photonic layer 320 may be formed. In an illustrative and nonlimiting example the handle wafer 310 comprises InP. The active photonic layer 320 may be formed over the handle wafer using, e.g. an epitaxial process to form a layer suitable for the optical function intended for the active photonic device 160. For example, when the active photonic device 160 is a laser, the active photonic layer 320 may include layers of $In_xGa_{1-x}As_yP_{1-y}$, with alternating layers having an alternating stoichiometry. Such layered structures are familiar to those skilled in the pertinent art. Alternatively, the active photonic layer 320 may be suitable for forming a diode for the active photonic device 160. In this case the active photonic layer 320 may comprise InGaAs. The active photonic layer 320 may also include separate layers for different devices, for example, layers for phase modulation, electro-absorption modulation, and gain/absorption. A dielectric layer 330, e.g. silicon oxide may optionally be formed on the active photonic layer 320 to aid the process of joining the subassembly 300 to the cladding layer 185.

Figure 2G:
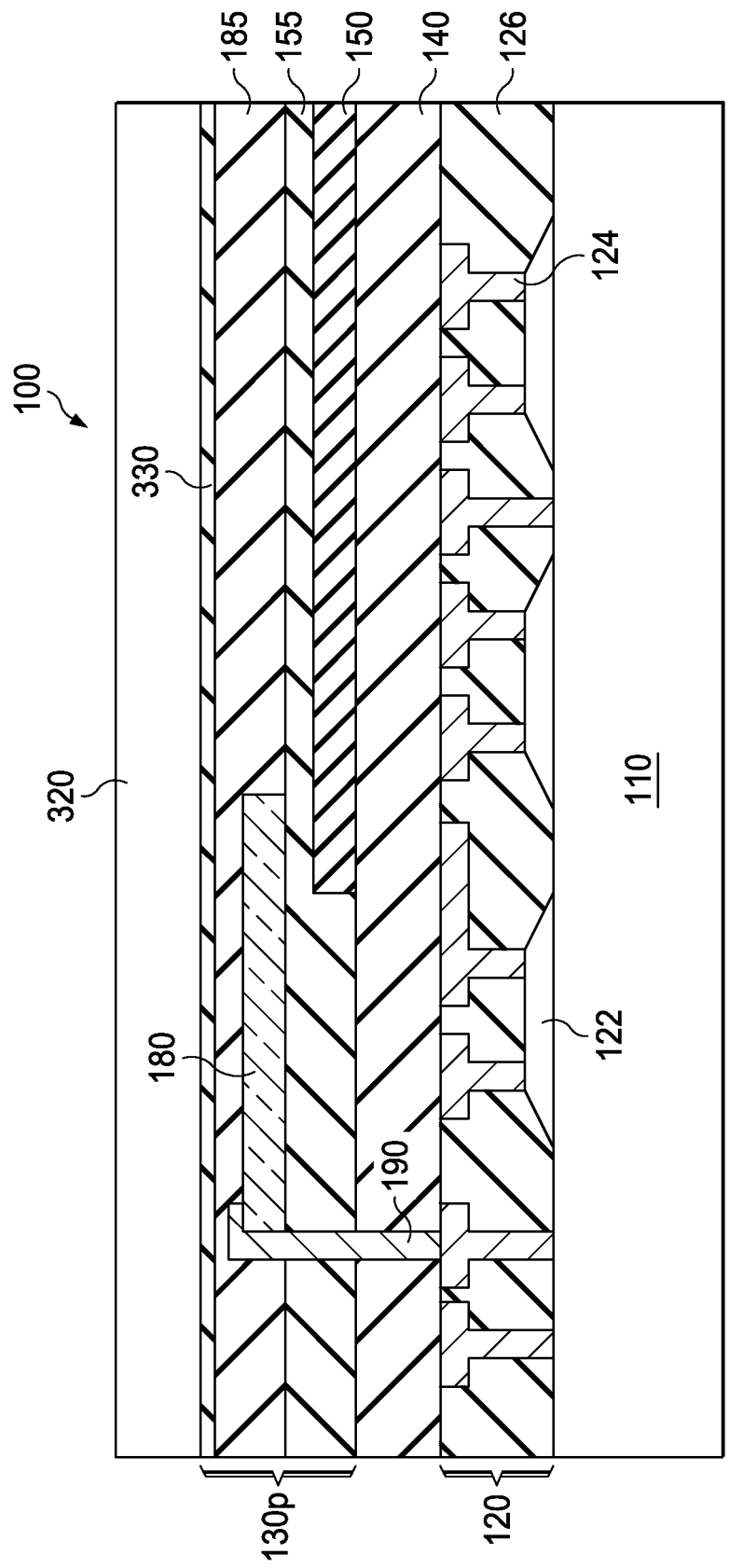

Returning to FIG. 2F, the subassembly 300 is placed in contact with the cladding layer 185 and joined by direct wafer bonding. The handle wafer 310 is then removed by conventional methods, e.g. backgrind and/or a wet chemical etch. The resulting assembly is illustrated in FIG. 2G. The dielectric layer 330, if used, functionally becomes part of the cladding layer 185.

Figure 2H:
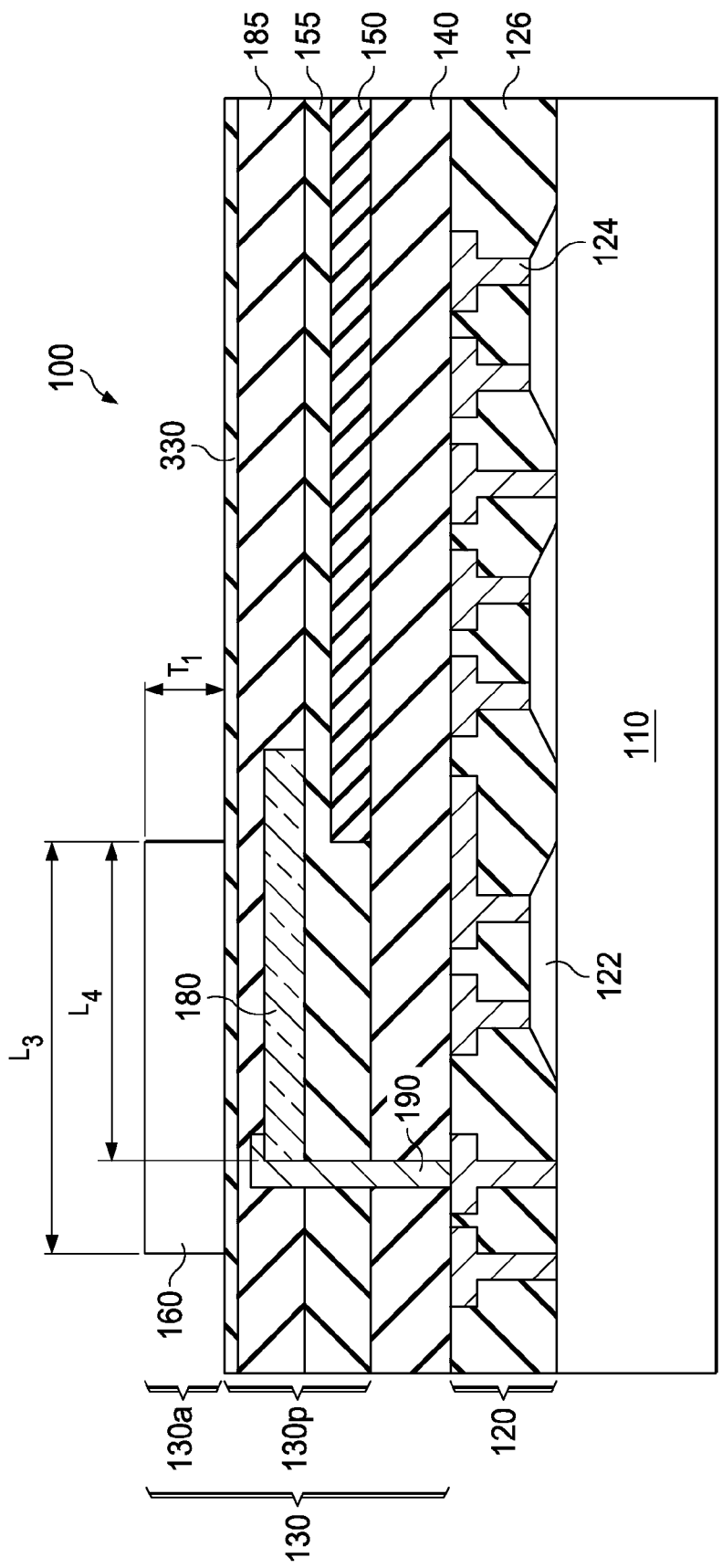

FIG. 2H illustrates the device 100 after the active photonic layer 320 is patterned, e.g. conventionally, to produce the active photonic device 160. In some embodiments the active photonic device 160 may be located at least partially over the transition element 180 in a manner that results in a desired optical coupling therebetween. In some embodiments the active photonic device 160 may be located completely over the transition element 180 such that the transition element 180 is part of the waveguide structure in the active photonic device 160. The dimensions of the active photonic device 160 may be any value as needed to produce the desired optical function. In an illustrative and nonlimiting example, the active photonic device 160 when configured as a laser may have a thickness $T_1$ of about 2 μm, a length $L_3$ of about 200 μm and a width W normal to $T_1$ and $L_3$ of about 5 μm. When configured as a diode, $T_1$, $L_3$ and W may be respectively be about 2 μm, about 20 μm, and about 5 μm.

The active photonic device 160 overlaps the transition element 180 with an overlap length of $L_4$. The length $L_4$ may be selected to allow slow and adiabatic optical mode evolution for maximized coupling efficiency. In some embodiments, as illustrated, the active photonic device 160 does not overlap the dielectric waveguide 150 when the transition element 180 is used to avoid the optical signal bypassing the transition element 180.

Figure 2I:
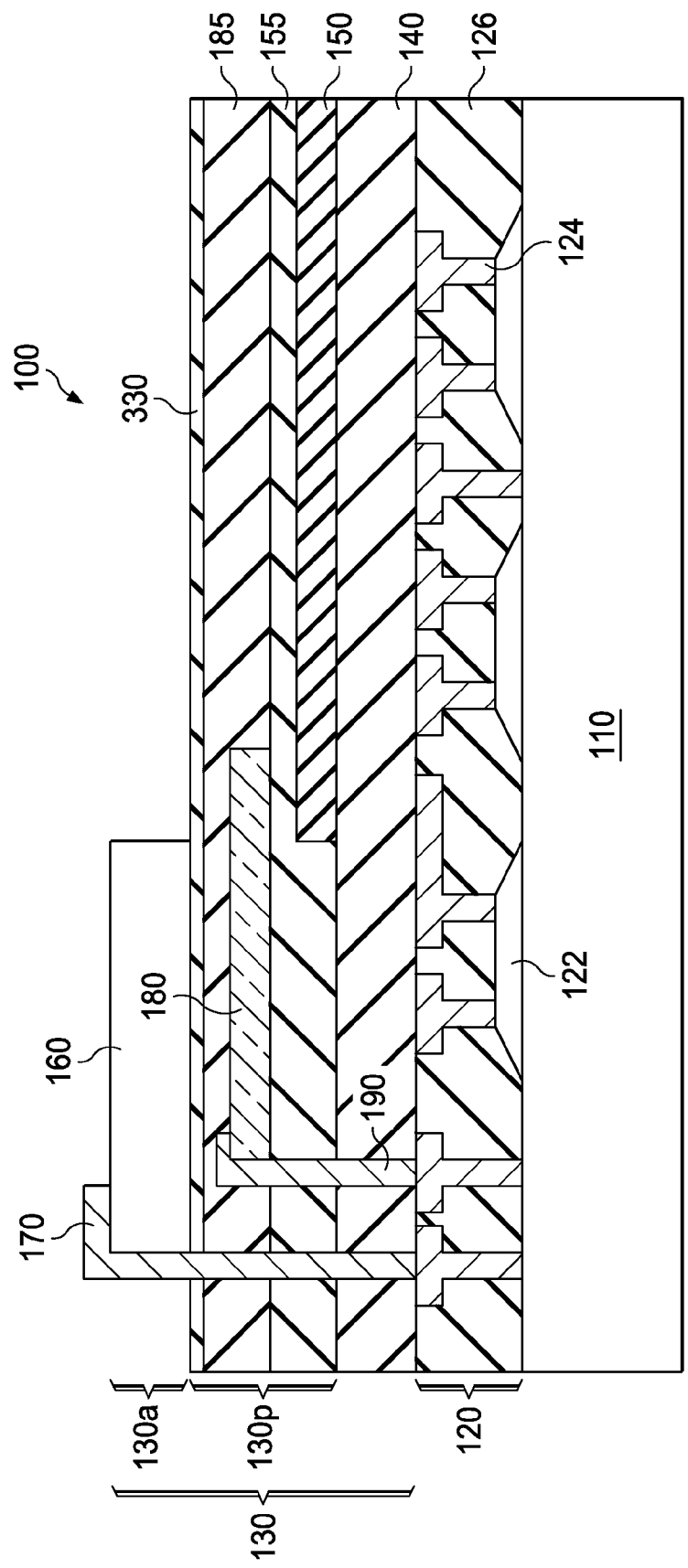

In FIG. 2I, the via structure 170 has been formed by conventional processing to provide a conductive path between the electronic device layer 120 and the active photonic device 160. When the active photonic device 160 is a receiving element, e.g. a photodiode, the via structure 170 may conduct an electrical signal produced by the active photonic device 160 to the electronic device layer 120 for electrical processing. On the other hand, when the active photonic device 160 is an emitting element such as a laser, the via structure 170 may conduct a modulated or CW signal from the electronic device layer 120 to the active photonic device 160.

FIGS. 4A and 4B respectively illustrate sectional and plan views of an embodiment in which the transition element 180 is omitted from the device 100 such that an active photonic device 410 and the dielectric waveguide 150 are directly optically coupled. In this embodiment the refractive index contrast between the semiconducting material of the active photonic device 410 and the dielectric material of the dielectric waveguide 150 may result in significant coupling losses. To reduce such losses the profile of the active photonic device 410 may be formed to include the illustrated step height transition.

The active photonic device 410 may include any number of steps, e.g. four in the illustrated example. The thickness of the active photonic device 410 decreases in the direction of signal propagation from the active photonic device 410 to the dielectric waveguide 150, and increases in the direction of signal propagation from the dielectric waveguide 150 to the active photonic device 410. The thinnest portion of the active photonic device 410 may be one tenth the thickness of the thickest portion. Thus, for example, a portion 420 of the active photonic device 410 may be about 2 μm thick, and a portion 430 may be about 0.2 μm thick. It is believed that thickness reduction may sufficiently reduce the mode index of the active photonic device 410 to be comparable to that of the dielectric waveguide 150, thus improving the optical coupling between the active photonic device 410 and the dielectric waveguide 150.

In another embodiment exemplified by FIGS. 5A-5L, the passive photonic layer 130p may be formed separately from the substrate 110 supporting the electronic device layer 120. Such embodiments ensure that the electronic device layer 120 is not exposed to high temperatures associated with forming the dielectric waveguide 150, the active photonic layer 320, the semiconductor layer 210 or the various cladding layers. In FIGS. 5A-5L like reference numbers refer to like features in FIGS. 1, 2A-2I and 3.

Figure 5A:
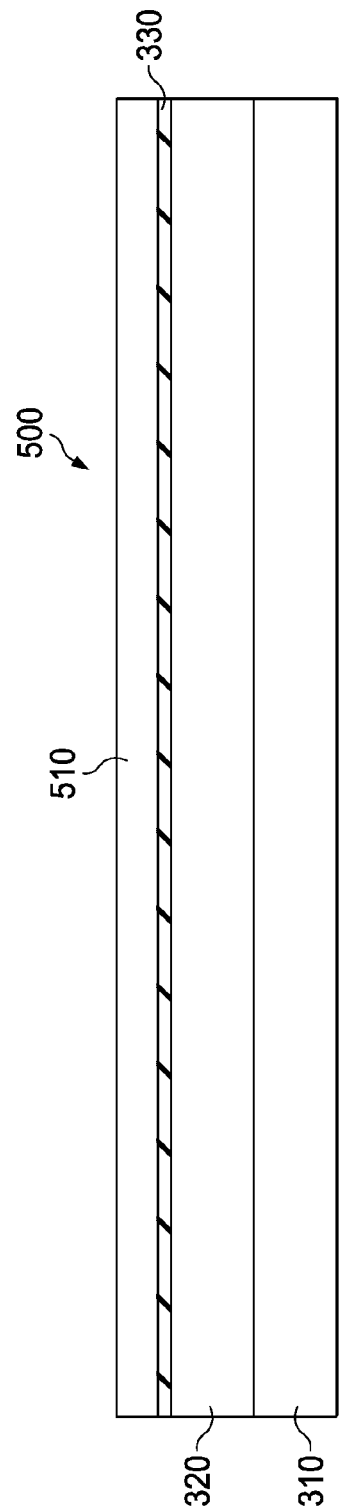

FIG. 5A illustrates a subassembly 500 including the handle waver 310 with the active photonic layer 320 and dielectric layer 330 located thereover. A semiconductor layer 510 is formed over the dielectric layer 330. The semiconductor layer 510 may be formed using a higher temperature process than used to form the semiconductor layer 210 by virtue of the absence of the electronic device layer 120. If desired an annealing process may be used to recrystallize the semiconductor layer 510. An annealing process may include heating the subassembly 500 to a temperature within a range of about 400° C. to about 600° C. Such temperatures are typically outside of an allowable temperature range of a completed integrated circuit, e.g. the electronic device layer 120. When the transition element 180 is formed from the layer 510 the optical unit loss of the transition element is expected to be reduced by at least about 50%, e.g. to 5 dB/cm or less.

FIG. 5B illustrates the subassembly 500 after patterning the semiconductor layer 510 to form the transition element 180. Again, the patterning process may be conventional. The cladding layer 185 has been formed over the transition element 180 and polished to form a planar surface.

FIG. 5C illustrates the subassembly after formation of the dielectric waveguide 150 and the cladding layer 155. As before the dielectric waveguide 150 may be formed by patterning a blanket dielectric layer. The process temperature used to form the blanket dielectric layer may be higher than that used form the dielectric layer in FIG. 2B, providing for a greater degree of freedom in forming the dielectric material of the dielectric waveguide 150. The cladding layer 155 has been formed over the dielectric waveguide 150 and polished to form a planar surface.

Figure 5D:
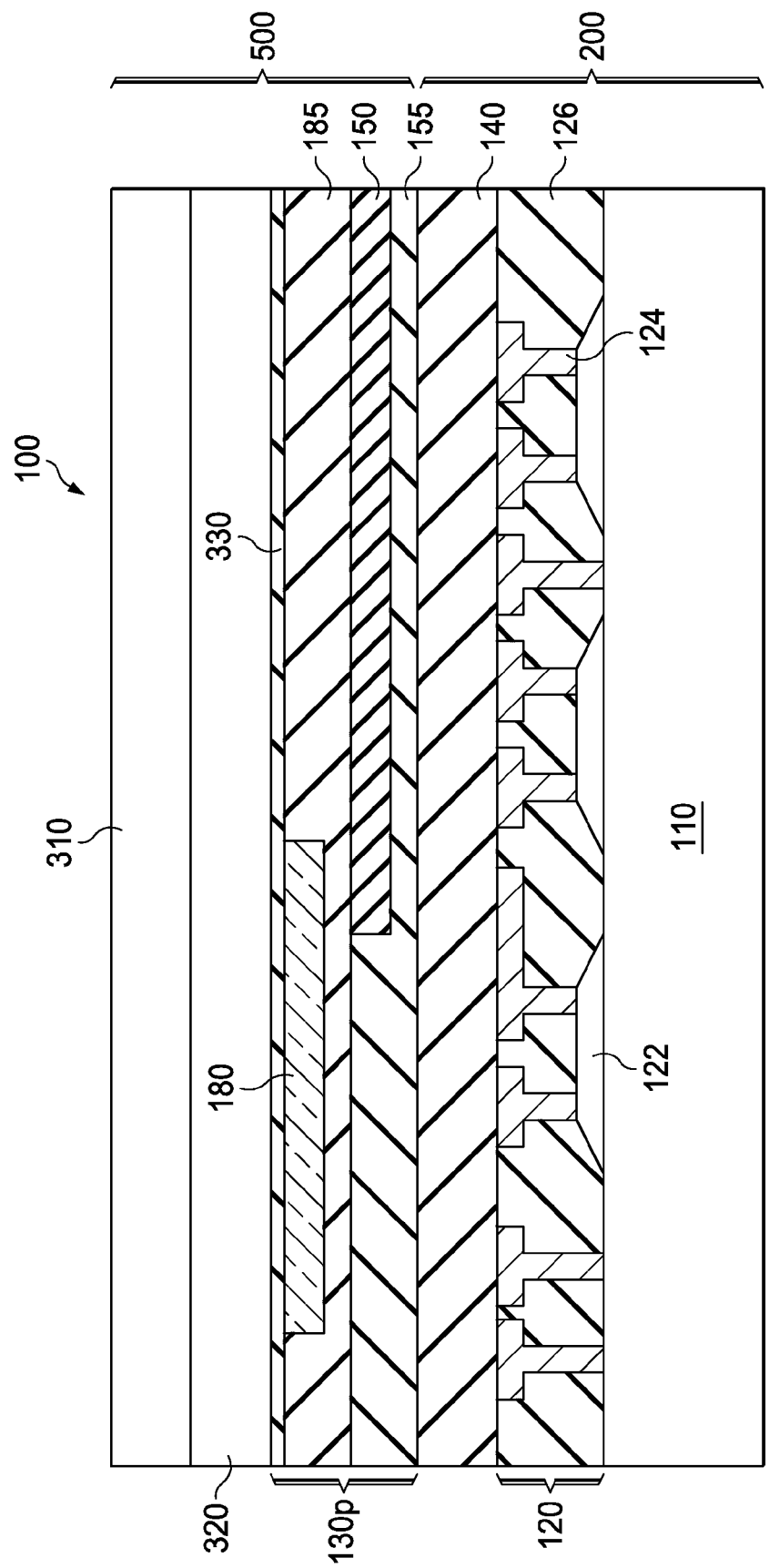
Figure 5E:
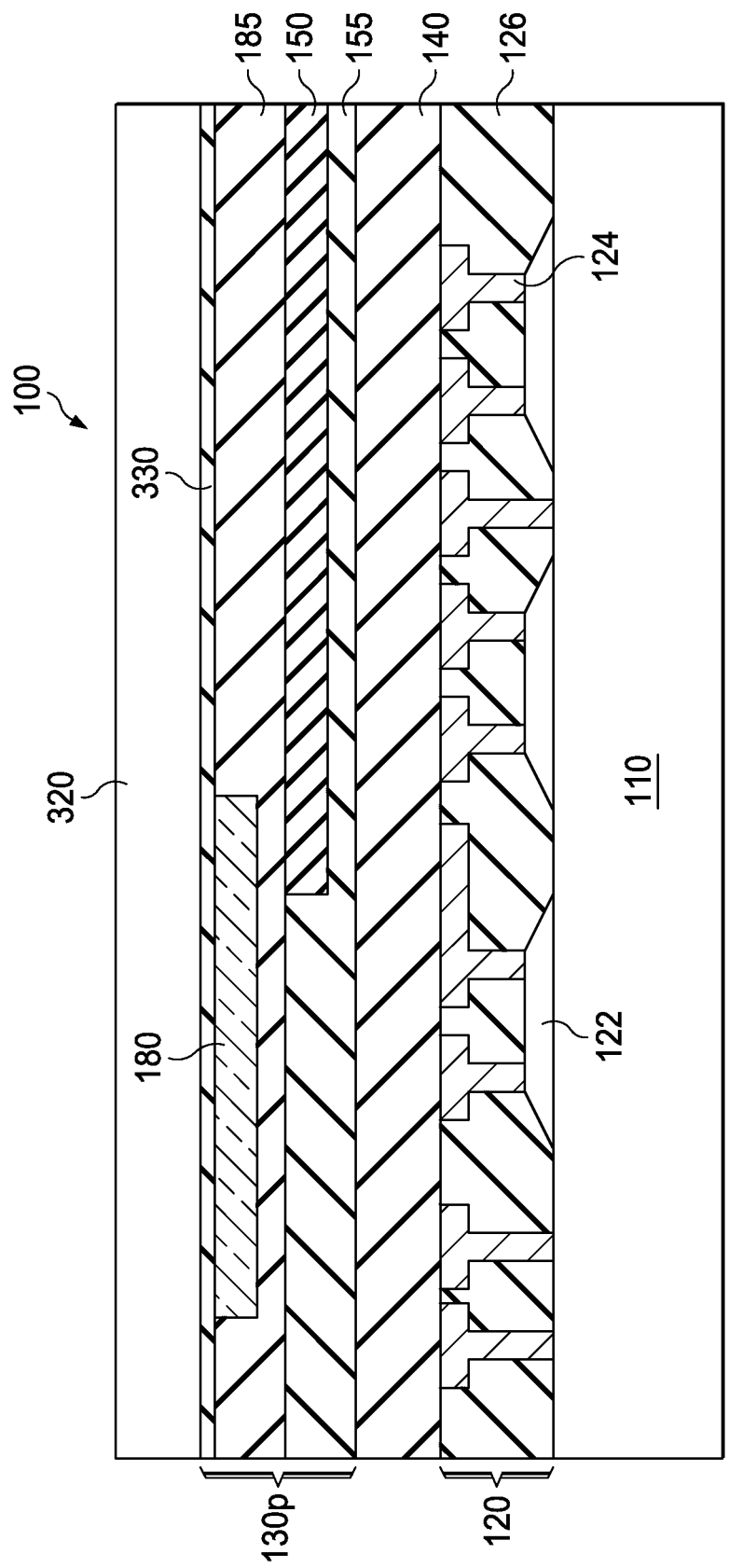
Figure 5F:
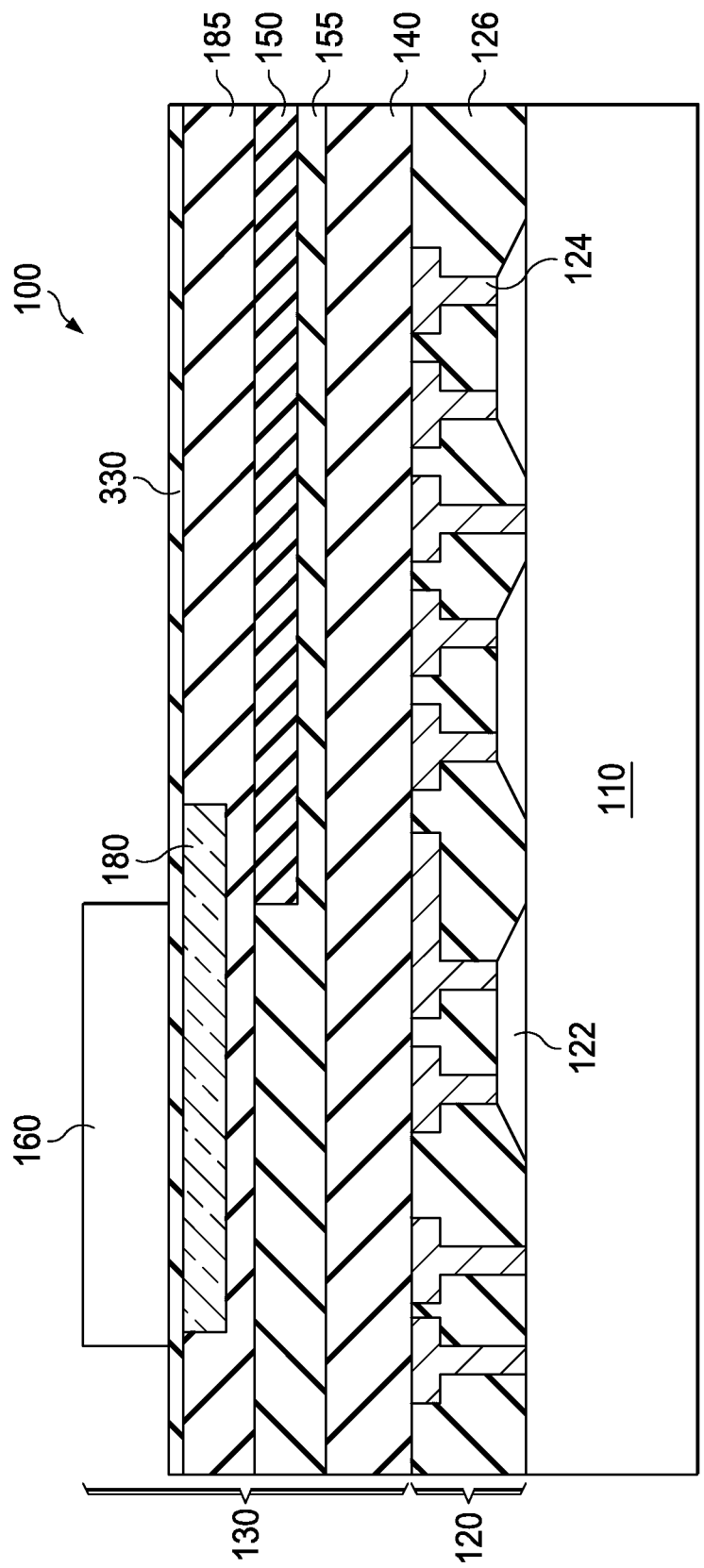
Figure 5G:
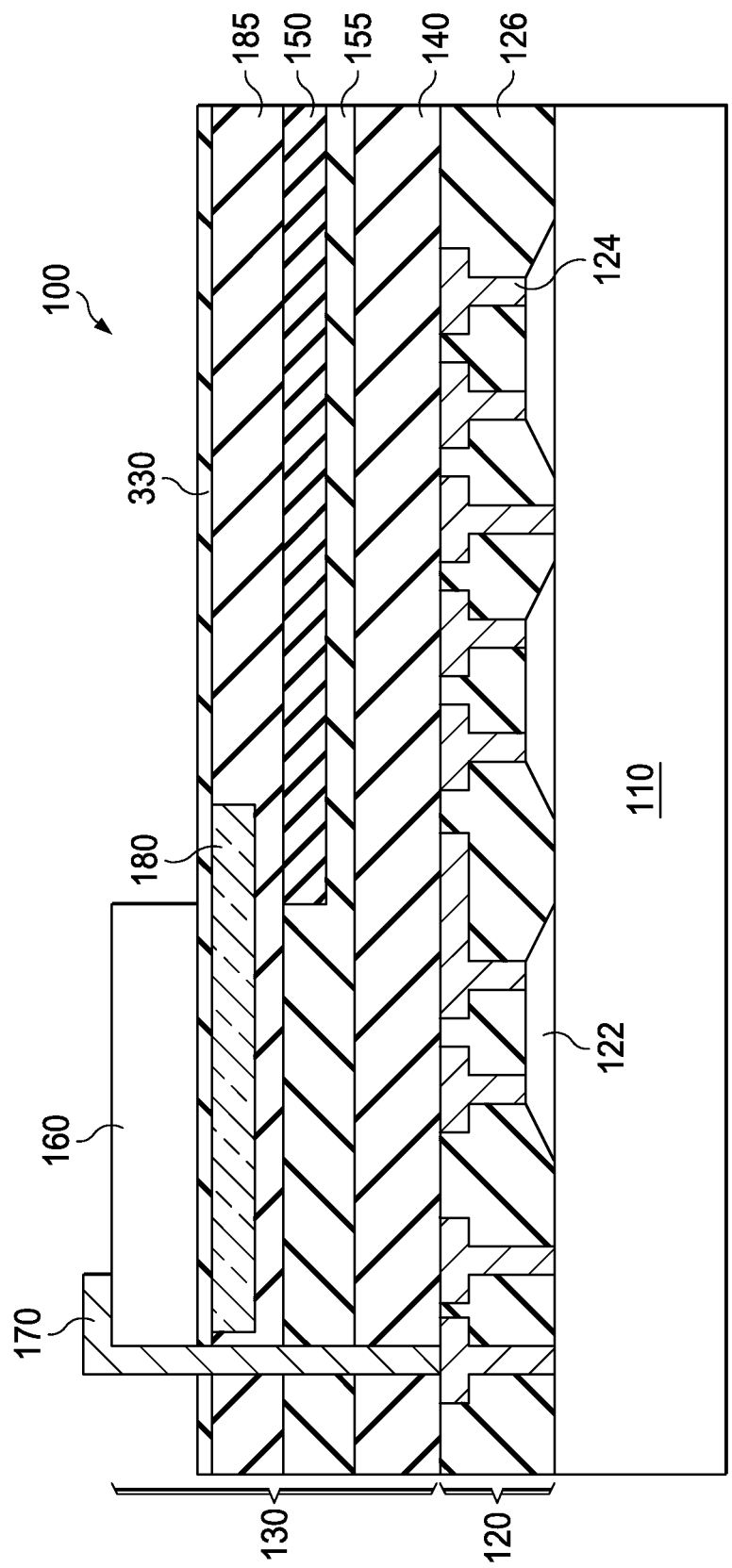

In FIG. 5D, the subassembly 500 has been joined to the subassembly 200 (FIG. 2B), e.g. by direct wafer bonding, with the cladding layer 155 bonded to the cladding layer 140. The combined assembly may be processed as described previously to remove the handle wafer 310 (FIG. 5E), form the active photonic device 160 (FIG. 5F) and form the via structure 170 (FIG. 5G). The device 100 in FIG. 5G is illustrated with the via structure 190 omitted. In this case the device 100 may be operated without biasing the transition element 180.

Figure 6A:
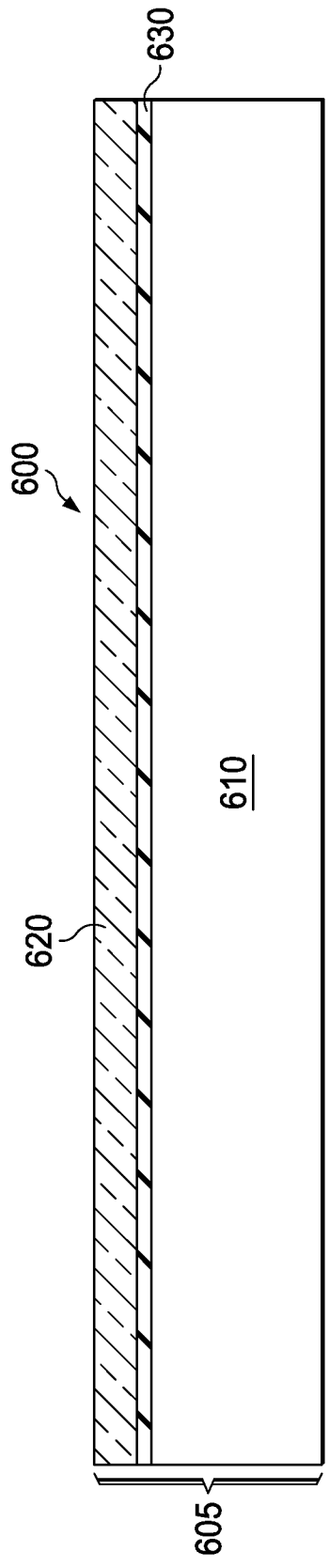

FIGS. 6A-6G illustrate another embodiment of a method for forming the device 100 in which an SOI wafer is used to provide a crystalline semiconductor layer from which the transition element 180 is formed. FIG. 6A illustrates an assembly 600 at an early stage of formation, comprising a silicon-over-insulator (SOI) substrate 605. The SOI substrate includes a silicon substrate 610 (a first handle wafer), e.g. a silicon wafer, a crystalline silicon layer 620 located thereover, and a dielectric (insulator) layer 630, e.g. silicon oxide, located therebetween.

Figure 6B:
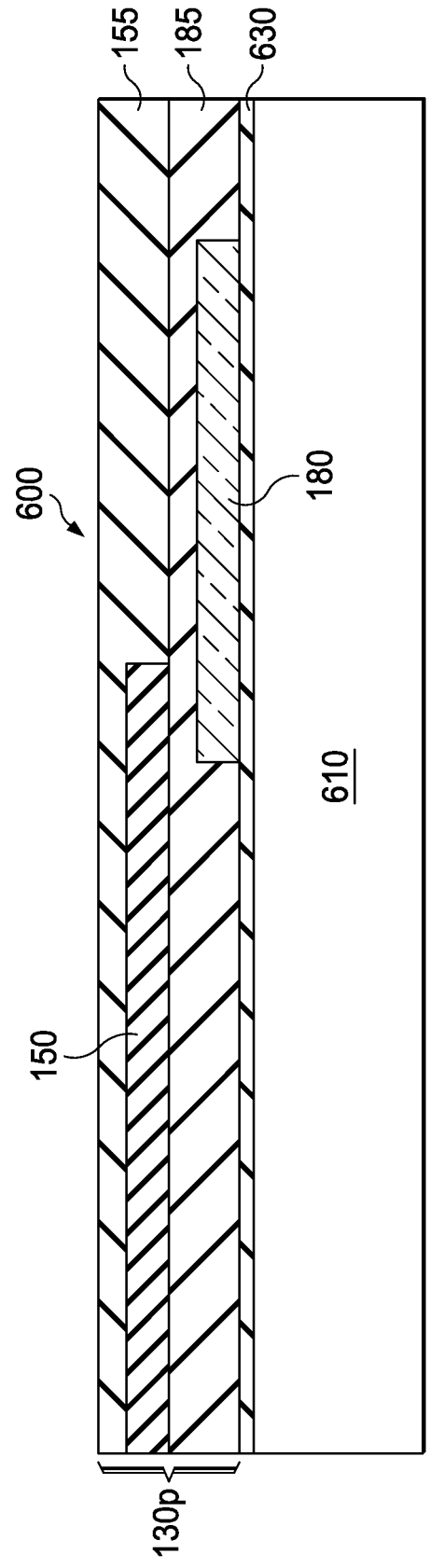

FIG. 6B illustrates the assembly 600 after the crystalline semiconductor layer 620 has been patterned to form the optical transition element 180. The passive optical element 150 and the cladding layers 155 and 185 have also been formed as previously described. The transition element 180 in this embodiment is monocrystalline by virtue of being formed from the crystalline semiconductor layer 620.

Figure 6C:
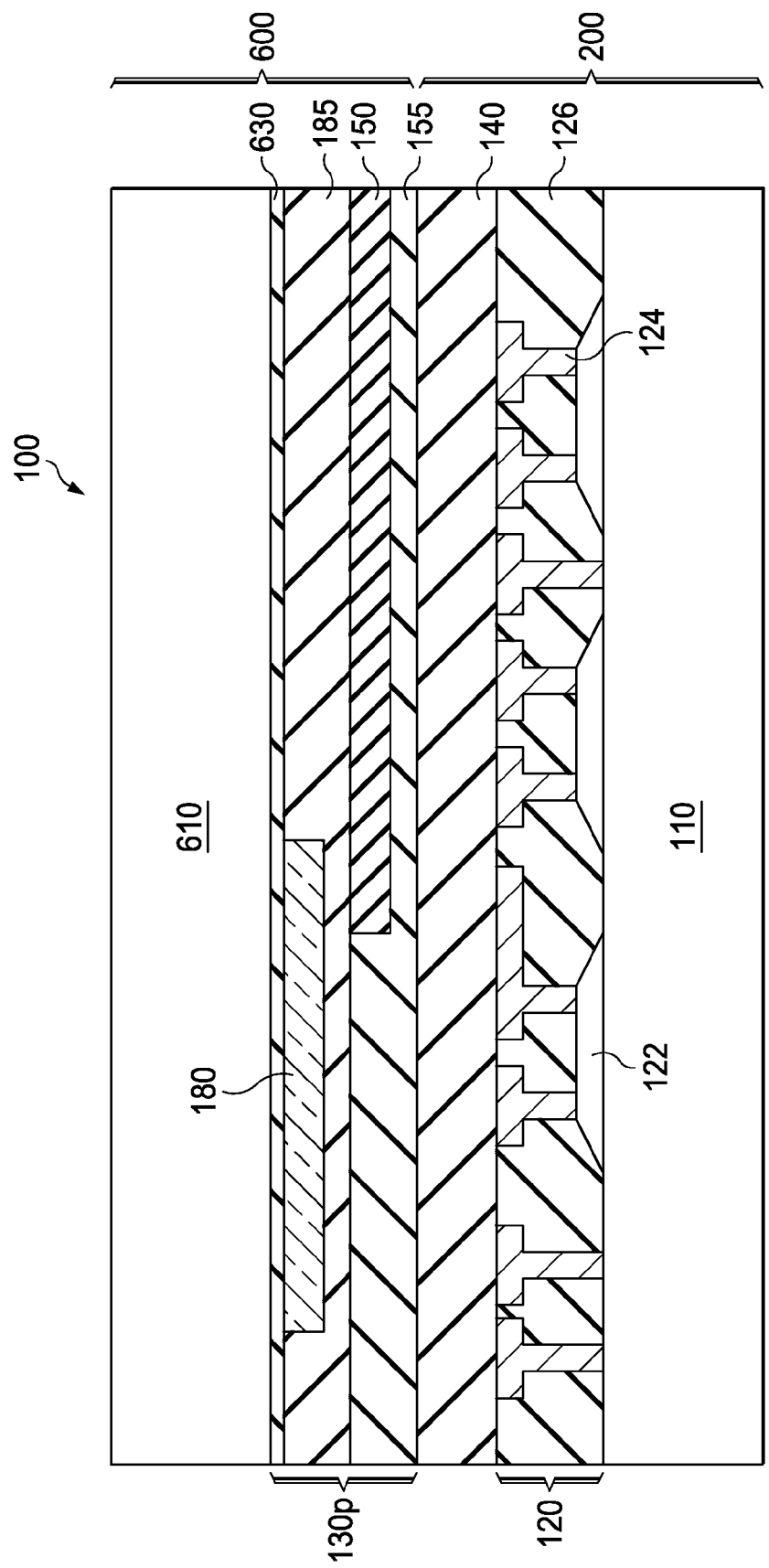
Figure 6D:
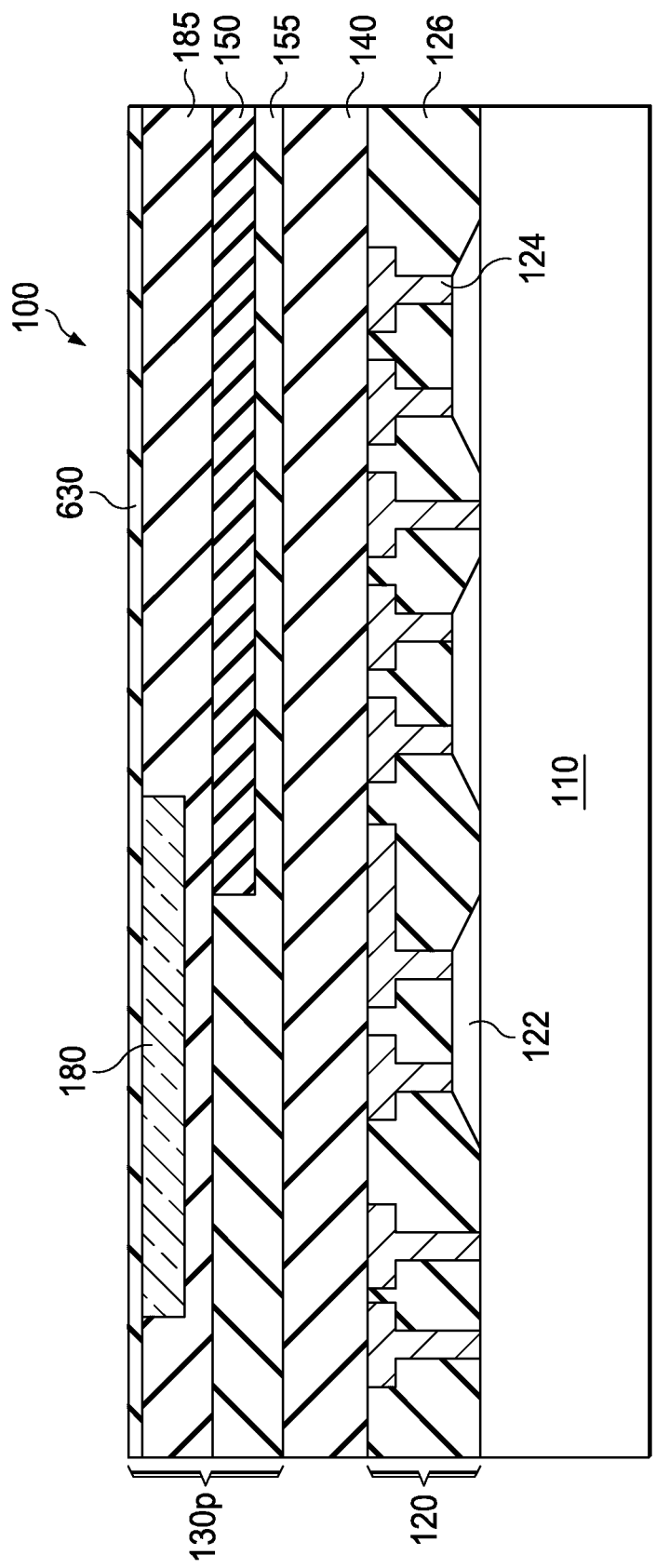

In FIG. 6C the assembly 600 has been joined to the assembly 200, e.g. by direct wafer bonding. This configuration is analogous to that illustrated in FIG. 5D, but the embodiment of FIG. 6C lacks an active photonic layer. The semiconductor substrate 610 may be removed by backgrind and/or wet chemical etch, stopping on the dielectric layer 630 as illustrated in FIG. 6D.

Figure 6E:
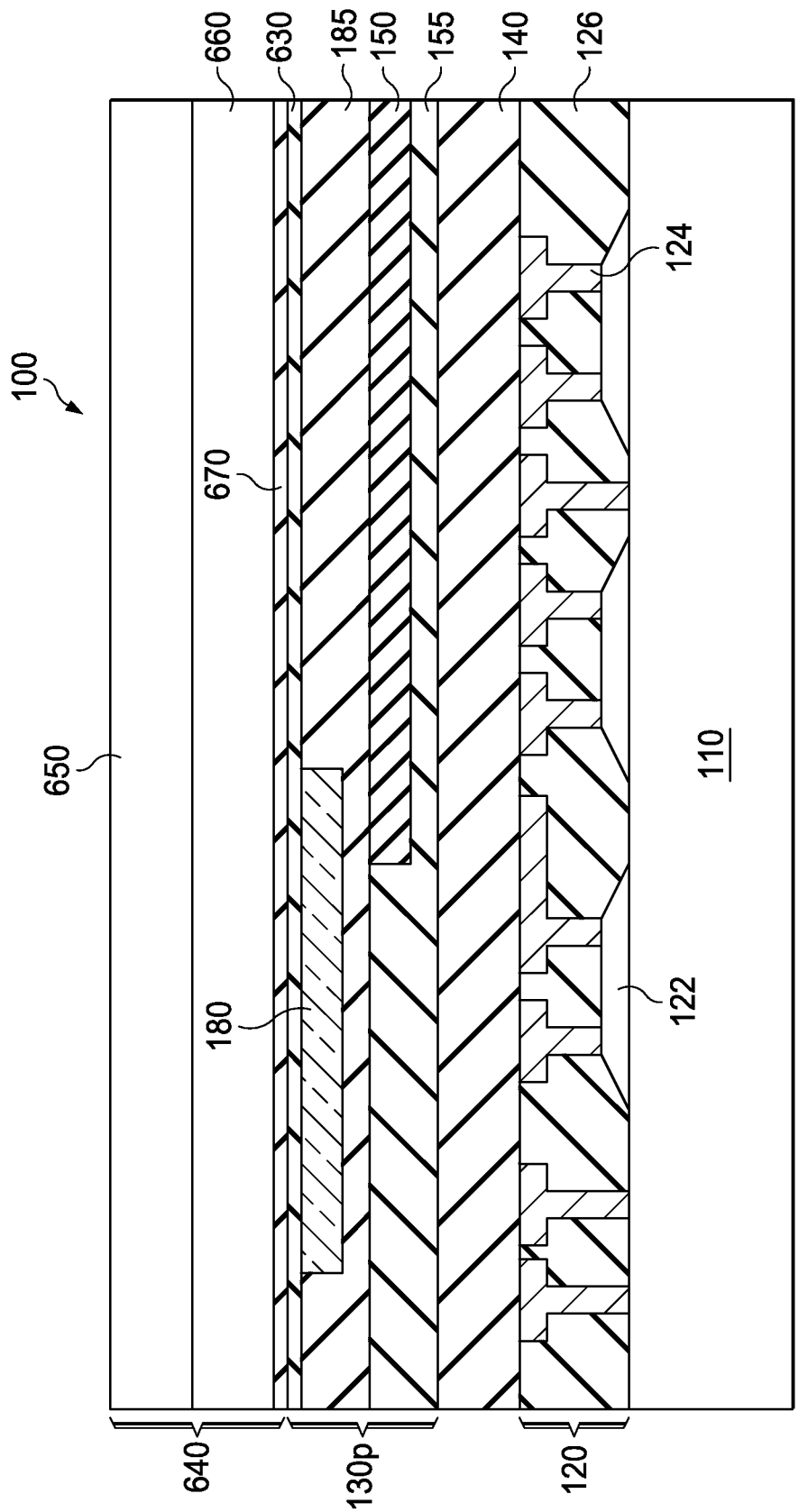

In FIG. 6E an assembly 640 has been joined to the dielectric layer 630 by direct wafer bonding. The assembly 640 includes a semiconductor substrate 650 (a second handle wafer), an active photonic layer 660 and an optional dielectric layer 670 to facilitate the wafer bonding process.

Figure 6F:
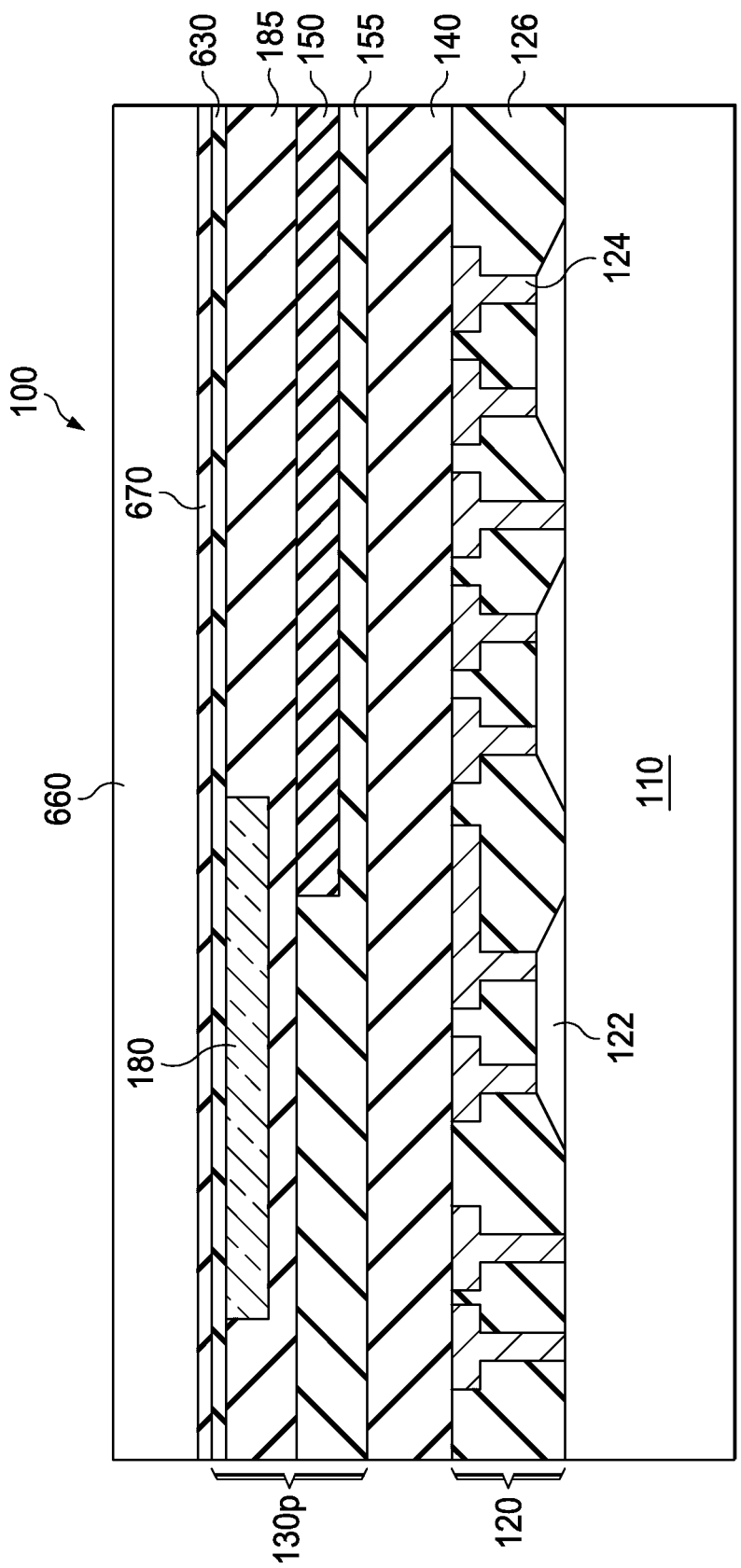

In FIG. 6F the semiconductor substrate 650 has been removed, again by backgrind and/or wet chemical etch, to expose the active photonic layer 660. Processing may then continue as described beginning with FIG. 5F to complete forming the device 100.

Because the semiconductor layer 620 is crystalline, it is expected that the optical loss imposed by the optical transition element 180 formed from the crystalline semiconductor layer 620 will be significantly lower than the loss imposed by, e.g. amorphous or polycrystalline silicon. For example, the optical loss from the optical transition element 180 formed in this manner is expected to be less than about 2 dB/cm, as compared to about 10-20 dB/cm for amorphous or polycrystalline silicon. Also, because of the absence of the III-V active photonic layer and the electronic layer during the processing of the passive optical element, one can use considerably higher temperatures, for example, up to 1200° C., to further reduce the loss in the passive elements. It is expected that the lower loss will allow, e.g. a photonic-electronic device design to require fewer gain stages, and provide significantly improved performance.

Those skilled in the art to which this application relates will appreciate that other and further additions, deletions, substitutions and modifications may be made to the described embodiments.

What is claimed is:

1. A device, comprising:
   a substrate;
   a passive photonic layer located over said substrate and including at least one silicon-based dielectric sassive photonic element configured to propagate an optical signal therein;
   an electronic layer located between said substrate and said passive photonic layer, and including at least one electronic device configured to propagate an electrical signal therein; and
   an active photonic layer located over said passive photonic layer and including a III-V based, active photonic device optically coupled to said silicon-based dielectric passive photonic element and configured to convert between said electrical signal and said optical signal, and
   wherein the III-V based, active photonic device is located at least partially over the silicon-based dielectric passive photonic element or is located at least partially over a silicon-based semiconductor, optical transition element overlapping the silicon-based dielectric passive photonic element.

2. The device as recited in claim 1, wherein said active photonic layer includes a laser configured to generate said optical signal in response to said electrical signal.

3. The device as recited in claim 1, wherein said active photonic layer includes a diode configured to generate said electrical signal in response to said optical signal.

4. The device as recited in claim 1, wherein said III-V based active photonic device includes a modulator configured to modulate said optical signal in response to said electrical signal.

5. The device as recited in claim 1, further comprising a via structure located to conduct said electrical signal between said III-V based active photonic device and said electronic device.

6. The device as recited in claim 1, further comprising a silicon-based, optical transition element optically coupled between said III-V based, active photonic device and said silicon-based passive photonic element.

7. The device as recited in claim 1, wherein said active photonic device comprises an indium phosphide based material.

8. The device as recited in claim 6, wherein said optical transition element is monocrystalline.

9. The device as recited in claim 6, further comprising forming a via structure within said electronic layer and said silicon-based, optical transition element, said via structure being configured to bias said optical transition element.

10. The device as recited in claim 1, wherein said optical transition element has a optical unit loss of about 2 dB/cm or less.

11. A method, comprising:
   forming a passive photonic layer over a device substrate, said passive photonic layer including at least one silicon-based dielectric passive photonic element configured to propagate an optical signal therein;
   forming an electronic layer located between said device substrate and said passive photonic layer, said electronic layer including at least one electronic device configured to propagate an electrical signal therein; and
   forming an active photonic layer over said passive photonic layer, said active photonic layer including a III-V based, active photonic device optically coupled to said silicon-based dielectric passive photonic element and configured to convert between said electrical signal and said optical signal, wherein the III-V based, active photonic device is located at least partially over the silicon-based dielectric passive photonic element or is located at least partially over a silicon-based, optical transition element overlapping the silicon-based dielectric passive photonic element.

12. The method as recited in claim 11, wherein forming said III-V based, active photonic layer includes transferring a semiconductor layer from a handle substrate to said device substrate.

13. The method as recited in claim 11, wherein forming said passive photonic layer includes first forming said passive photonic layer over a handle substrate and then joining said passive photonic layer to said electronic layer.

14. The method as recited in claim 11, further comprising forming a via structure located to conduct said electrical signal between said electronic device and said III-V based, active photonic device.

15. The method as recited in claim 11, further comprising forming between said passive photonic layer and said active photonic layer an optical transition layer that includes a silicon-based semiconductor, optical transition element optically coupled between said III-V based, active photonic device and said silicon-based dielectric passive photonic element.

16. The method as recited in claim 15, wherein said optical transition element is monocrystalline.

17. The method as recited in claim 15, further comprising forming a via structure within said electronic layer and said silicon-based optical transition element, said via structure being configured to bias said optical transition element.

18. The method as recited in claim 11, wherein said active photonic device comprises an indium phosphide based material.

19. The method as recited in claim 11, wherein said optical transition element has an optical unit loss of about 2 dB/cm or less.

20. The method as recited in claim 11, wherein said passive photonic layer includes a silicon oxide cladding medium.

21. The device as recited in claim 1, wherein the photonic layers are configured to operate within a range from about 1200 nm to about 2000 nm in wavelength.

22. The device as recited in claim 1, wherein the device includes a silicon-based active optical element.

23. The method as recited in claim 8, wherein the photonic layers are configured to operate within a range from about 1200 nm to about 2000 nm in wavelength.

* * * * *